(12) United States Patent
Shimizu et al.

(10) Patent No.: US 8,566,763 B2
(45) Date of Patent: Oct. 22, 2013

(54) LOGIC CIRCUIT DESIGN METHOD, LOGIC DESIGN PROGRAM, AND SEMICONDUCTOR INTEGRATED CIRCUIT

(75) Inventors: Hiroharu Shimizu, Kanagawa (JP); Yasuhiro Yadoguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/455,733

(22) Filed: Apr. 25, 2012

(65) Prior Publication Data

US 2012/0274354 A1    Nov. 1, 2012

(30) Foreign Application Priority Data

Apr. 26, 2011   (JP) .................................. 2011-097822

(51) Int. Cl.
*G06F 9/45*   (2006.01)

(52) U.S. Cl.
USPC ........................................................ 716/103

(58) Field of Classification Search
USPC ........................................................ 716/103
See application file for complete search history.

(56) References Cited

U.S. PATENT DOCUMENTS

| | | | | |
|---|---|---|---|---|
| 2002/0049955 | A1* | 4/2002 | Yamashita et al. | 716/1 |
| 2003/0101419 | A1* | 5/2003 | Yamashita et al. | 716/1 |
| 2011/0173584 | A1* | 7/2011 | Chen et al. | 716/108 |
| 2012/0159410 | A1* | 6/2012 | Jarrett | 716/108 |

FOREIGN PATENT DOCUMENTS

| | | |
|---|---|---|
| JP | 7-249968 A | 9/1995 |
| JP | 8-181574 A | 7/1996 |

* cited by examiner

*Primary Examiner* — Jack Chiang
*Assistant Examiner* — Mohammed Alam
(74) *Attorney, Agent, or Firm* — Sughrue Mion, PLLC

(57) ABSTRACT

A computer device which performs logic synthesis using hardware description and a component in a cell library and generates a net list of a logic circuit including a series path of a clock synchronous sequential circuit and a combinational circuit performs optimization processing for decreasing the number of gate stages in a critical path between sequential circuits in the data path by using a third sequential circuit having a negative-logic input terminal and a negative-logic non-inverted output terminal and a fourth sequential circuit having a negative-logic input terminal and a negative-logic inverted output terminal in addition to a first sequential circuit having a positive-logic input terminal and a positive-logic non-inverted output terminal and a second sequential circuit having a positive-logic input terminal and a positive-logic inverted output terminal.

12 Claims, 21 Drawing Sheets

LOGIC CIRCUIT DESIGN METHOD, LOGIC DESIGN PROGRAM, AND SEMICONDUCTOR INTEGRATED CIRCUIT

CROSS-REFERENCE TO RELATED APPLICATIONS

The disclosure of Japanese Patent Application No. 2011-097822 filed on Apr. 26, 2011 including the specification, drawings and abstract is incorporated herein by reference in its entirety.

BACKGROUND

The present invention relates to a logic circuit design method for generating a net list of a logic circuit including a series path of a clock synchronous sequential circuit and a combinational circuit, a logic design program used to implement the design method, and a semiconductor integrated circuit configured by applying the design method thereto, and particularly to a technique effectively applied to a logic synthesis tool for a data processing semiconductor integrated circuit such as a microcomputer or a data processor.

In a logic circuit which performs logic operations in synchronization with a clock has a data path prepared by disposing sequential circuits before and after a combinational circuit, and causes sequential circuits to perform input/output operations in a predetermined clock period, thereby performing logic operations while sequentially transferring data to the data path in synchronization with the clock. Accordingly, a logic operation time from when data is outputted from one sequential circuit until when the combinational circuit completes a logic operation on the inputted data and needs to shorter than a required clock period. In other words, the logic operation speed of the logic circuit is determined by a clock period required for the largest number of gate stages through which data is transferred from when the data is outputted from one sequential circuit until when the combinational circuit completes a logic operation on the inputted data. Accordingly, it is preferable that the number of gate stages be smaller in the sequential circuit as well. From such a viewpoint, Japanese Unexamined Patent Publication No. Hei 7 (1995)-249968 (Patent Document 1) and Japanese Unexamined Patent Publication No. Hei 8 (1996)-181574 (Patent Document 2) make it possible to decrease the number of gate stages in a clock synchronous sequential circuit itself.

SUMMARY

The present inventors have studied a decrease in the number of gate stages in the logic circuit which performs logic operations while transferring data in synchronization with the clock, from the viewpoint of data transfer between the combinational circuit and the sequential circuit in logic synthesis using a computer device. This viewpoint is completely different from that of Patent Documents 1 and 2. According to the study by the present inventors, it can be considered that the inputs of clock synchronous sequential circuits treated as components are implicitly standardized to positive-logic input in related art logic synthesis. For example, typical clock synchronous sequential circuits of the master-slave type fall into two kinds: a component having a positive-logic input terminal and a positive-logic non-inverted output terminal and a component having a positive-logic input terminal and a positive-logic inverted output terminal. In this case, the logic of combinational circuits disposed in the data path is not necessarily standardized to either positive logic or negative logic. Accordingly, in the case where a combinational circuit disposed at the preceding stage of a sequential circuit is a negative-logic circuit, for example an inverter for inverting the output of the combinational circuit is added at the preceding stage of the positive-logic input terminal of the sequential circuit. Alternatively, an inverter for inverting the output of a positive-logic combinational circuit which receives the inverted output of the preceding sequential circuit is added before the positive-logic input terminal of the subsequent sequential circuit. It has become apparent that such a path including the added inverter often becomes a critical path, leading to a major issue in speeding up the logic circuit by decreasing the number of gate stages.

It is an object of the present invention to provide a logic circuit design method for decreasing the number of gate stages by deleting a redundant inverter disposed in a logic circuit including a series path of a clock synchronous sequential circuit and a combinational circuit.

It is another object of the invention to provide a computer-executable program for easily implementing the method concerned. It is yet another object of the invention to provide a semiconductor integrated circuit to which the method concerned is applied.

The above and other objects and novel features of the present invention will become apparent from the description of this specification and the accompanying drawings.

A typical aspect of the invention disclosed in the present application will be briefly described as follows.

A computer device which performs logic synthesis using hardware description and a component in a cell library and generates a net list of a logic circuit including a series path of a clock synchronous sequential circuit and a combinational circuit performs optimization processing for decreasing the number of gate stages in a critical path between sequential circuits in the series path by using a third sequential circuit having a negative-logic input terminal and a negative-logic non-inverted output terminal and a fourth sequential circuit having a negative-logic input terminal and a negative-logic inverted output terminal in addition to a first sequential circuit having a positive-logic input terminal and a positive-logic non-inverted output terminal and a second sequential circuit having a positive-logic input terminal and a positive-logic inverted output terminal.

According to this, as necessary in the optimization processing, the first sequential circuit is replaced with the third sequential circuit, or the second sequential circuit is replaced with the fourth sequential circuit.

An effect obtained by the typical aspect of the invention disclosed in the present application will be briefly described as follows.

It is possible to decrease the number of gate stages by deleting redundant inverters disposed in the logic circuit including the series path of clock synchronous sequential circuits and combinational circuits.

DETAILED DESCRIPTION

1. Outline of Embodiments

Figure 1:
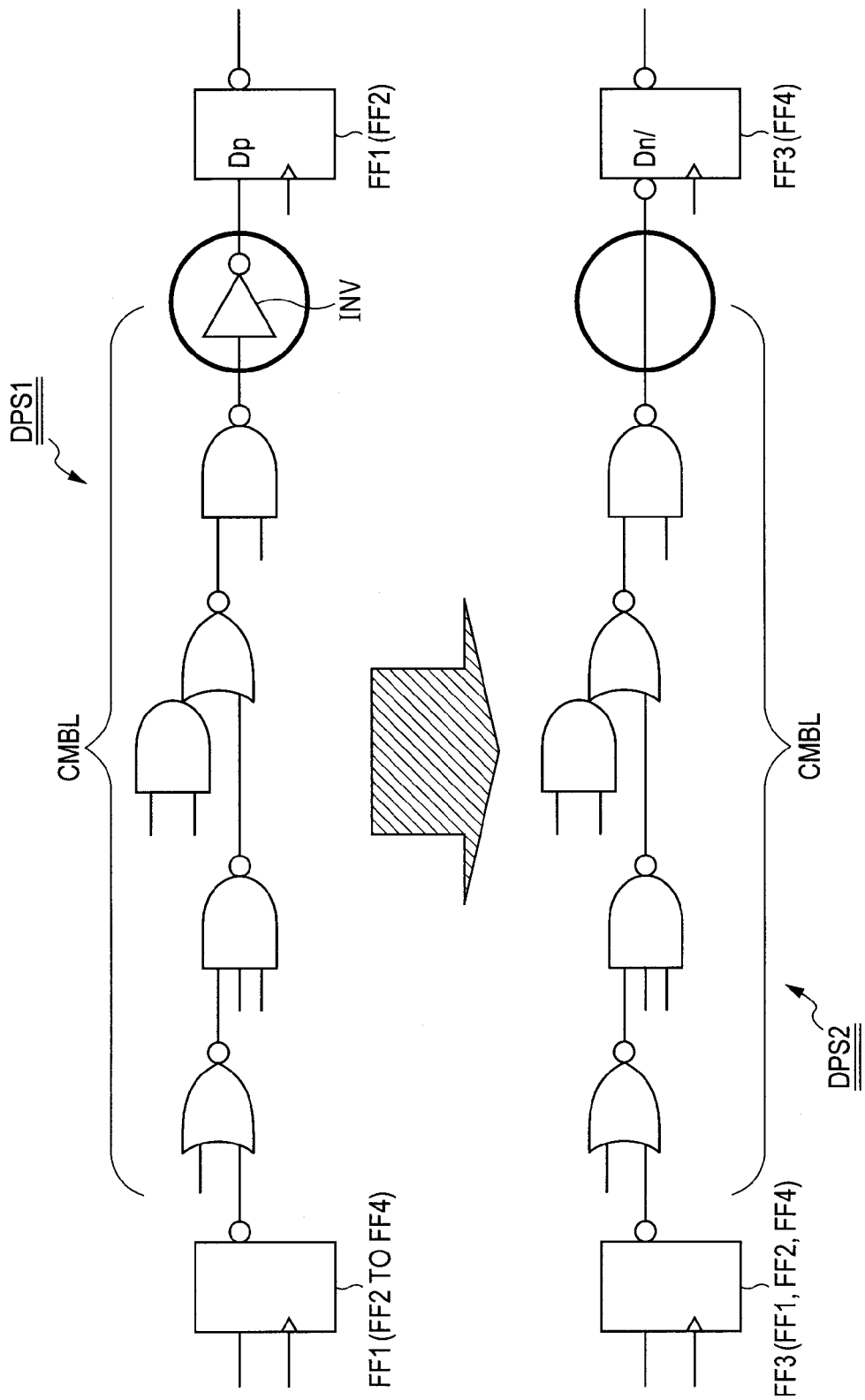
FIG. 1 is an explanation diagram illustrating a comparison between a series path without the application of a logic circuit design method according to the present embodiment and a series path obtained by applying the logic circuit design method.

First, exemplary embodiments of the invention disclosed in the present application will be outlined. Reference numerals in the drawings that refer to with parentheses applied thereto in the outline description of the exemplary embodiments are merely illustration of ones contained in the concepts of components marked with the reference numerals.

[1] Combined Use of Sequential Circuit Having Positive-Logic Input Terminal and Sequential Circuit Having Negative-Logic Input Terminal A logic circuit design method according to an exemplary embodiment of the invention is a method in which a computer device (3) performs logic synthesis using hardware description (1) and a component in a cell library (2) and generates a net list (31) of a logic circuit including a series path of a clock synchronous sequential circuit and a combinational circuit. In this method, the computer device performs optimization processing for decreasing the number of gate stages in a critical path between sequential circuits in the series path by using a third sequential circuit (FF3, FF13) having a negative-logic input terminal (Dn/) and a negative-logic non-inverted output terminal (Qn/) and a fourth sequential circuit (FF4, FF14) having a negative-logic input terminal (Dn/) and a negative-logic inverted output terminal (Dn) in addition to a first sequential circuit (FF1, FF11) having a positive-logic input terminal (Dp) and a positive-logic non-inverted output terminal (Qp) and a second sequential circuit (FF2, FF12) having a positive-logic input terminal (Dp) and a positive-logic inverted output terminal (QP/).

According to this, by replacing the first sequential circuit (FF11_b in FIG. 19) with the third sequential circuit (FF13_b in FIG. 19) as necessary in the optimization processing, it is possible to delete, for example, one inverter from the circuit disposed in the input stage of the first sequential circuit. Alternatively, by replacing the second sequential circuit (FF2_c in FIG. 9) with the fourth sequential circuit (FF4_c in FIG. 9), it is possible to delete, for example, one inverter from the circuit disposed in the input stage of the second sequential circuit. Therefore, it is possible to decrease the number of gate stages by deleting redundant inverters disposed in the logic circuit including the series path of clock synchronous sequential circuits and combinational circuits.

Figure 10:
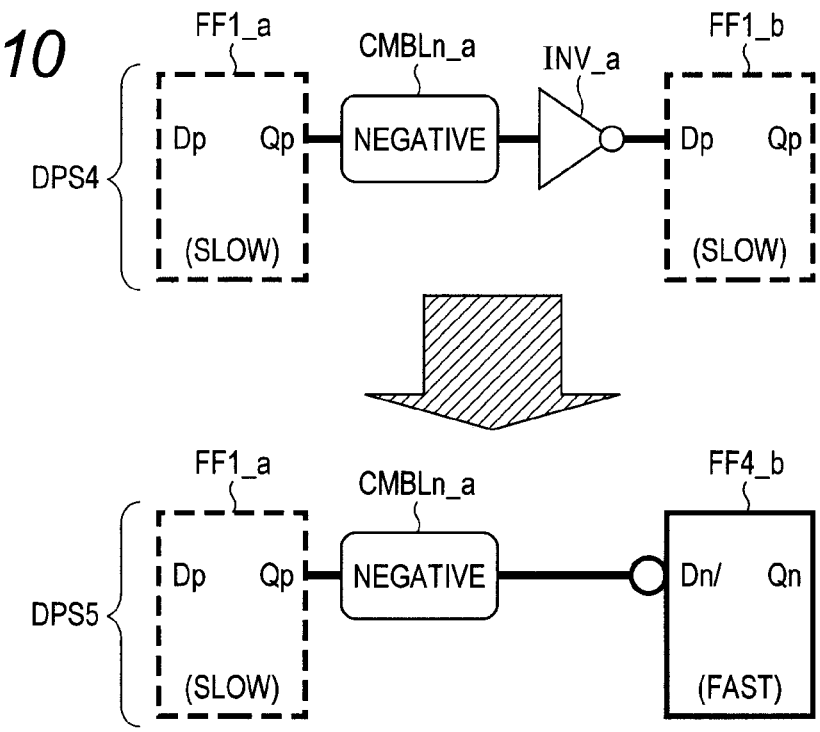
FIG. 10 is an explanation diagram showing another example of optimization processing in logic synthesis.
Figure 11:
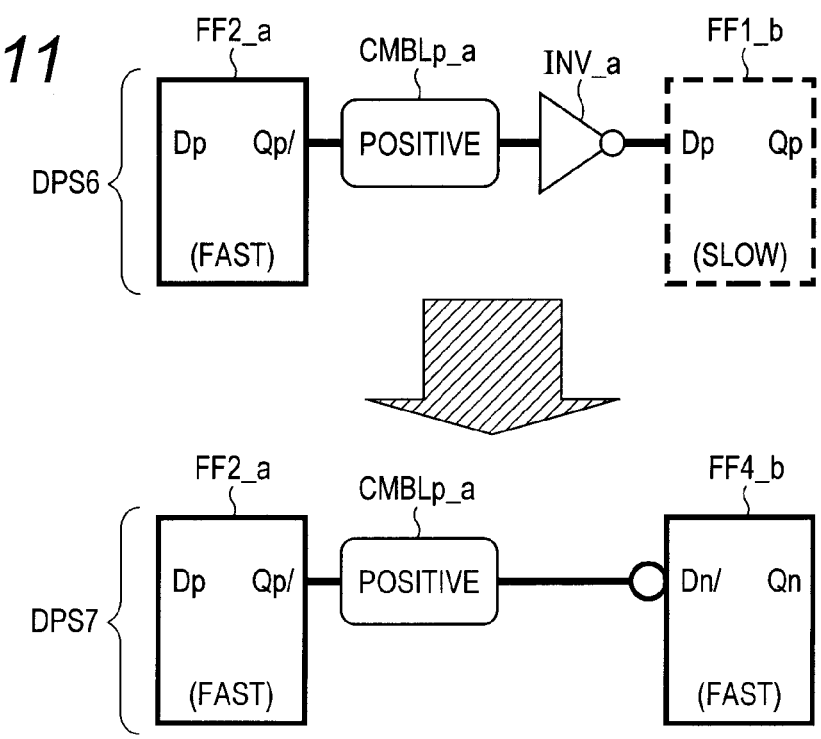
FIG. 11 is an explanation diagram showing yet another example of optimization processing in logic synthesis.

[2] Deletion of Polarity Matching Inverter for Positive Logic, Replacement of First Sequential Circuit with Fourth Sequential Circuit In the logic circuit design method according to item 1, in the case where a polarity matching inverter for positive logic can be disposed in a final stage of a combinational circuit coupled to a positive-logic input terminal of the first sequential circuit, the computer device deletes the polarity matching inverter and replaces the first sequential circuit with the fourth sequential circuit in the optimization processing (FIGS. 10 and 11).

This can contribute to a decrease in the number of gate stages in the critical path by deleting the polarity matching inverter for positive logic.

[3] Number of Gate Stages in Fourth Sequential Circuit is Smaller than Number of Gate Stages in First Sequential Circuit In the logic circuit design method according to item 2, the number of gate stages in the second sequential circuit is smaller by one than the number of gate stages in the first sequential circuit, the number of gate stages in the fourth sequential circuit (FF4_b in FIG. 10) is smaller by one than the number of gate stages in the first sequential circuit (FF1_b in FIG. 10), the number of gate stages in the second sequential circuit is smaller by one than the number of gate stages in the third sequential circuit, and the number of gate stages in the fourth sequential circuit is smaller by one than the number of gate stages in the third sequential circuit.

This makes it possible to decrease the number of gate stages within the sequential circuit itself and thereby ease the constraints of the number of gate stages in the critical path in the series path.

Figure 20:
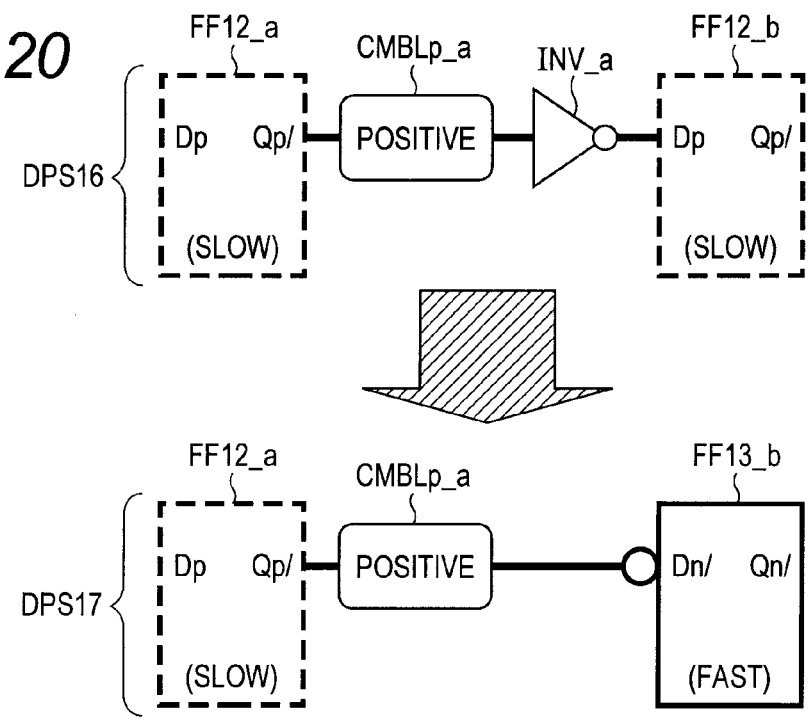
FIG. 20 is an explanation diagram showing yet another example of optimization processing in logic synthesis.

[4] Deletion of Polarity Matching Inverter for Positive Logic, Replacement of Second Sequential Circuit with Third Sequential Circuit In the logic circuit design method according to item 1, in the case where a polarity matching inverter for positive logic can be disposed in a final stage of a combinational circuit coupled to a positive-logic input terminal of the second sequential circuit, the computer device deletes the polarity matching inverter and replaces the second sequential circuit with the third sequential circuit in the optimization processing (FIG. 20).

This can contribute to a decrease in the number of gate stages in the critical path by deleting the polarity matching inverter for positive logic.

[5] Number of Gate Stages in Third Sequential Circuit is Smaller than Number of Gate Stages in Second Sequential Circuit In the logic circuit design method according to item 4, the number of gate stages in the first sequential circuit is smaller by one than the number of gate stages in the second sequential circuit, the number of gate stages in the third sequential circuit (FF13_b in FIG. 20) is smaller by one than the number of gate stages in the second sequential circuit (FF12_b in FIG. 20), the number of gate stages in the first sequential circuit is smaller by one than the number of gate stages in the fourth sequential circuit, and the number of gate stages in the third sequential circuit is smaller by one than the number of gate stages in the fourth sequential circuit.

This makes it possible to decrease the number of gate stages within the sequential circuit itself and thereby ease the constraints of the number of gate stages in the critical path in the series path.

[6] Storage of First to Fourth Sequential Circuits as Separate Components

In the logic circuit design method according to item 1, the cell library has the first sequential circuit, the second sequential circuit, the third sequential circuit, and the fourth sequential circuit as separate components.

This makes it possible to easily obtain components of sequential circuits necessary for logic circuit design for deleting redundant inverters.

[7] Combined Use of Sequential Circuit Having Positive-Logic Input Terminal and Sequential Circuit Having Negative-Logic Input Terminal A logic design program (30) according to another embodiment of the invention is a program that can be executed by a computer device which performs logic synthesis using hardware description and a component in a cell library and generates a net list of a logic circuit including a series path of a clock synchronous sequential circuit and a combinational circuit. The program causes the computer device to execute optimization processing for decreasing the number of gate stages in a critical path between sequential circuits in the data path by using a third sequential circuit having a negative-logic input terminal and a negative-logic non-inverted output terminal and a fourth sequential circuit having a negative-logic input terminal and a negative-logic inverted output terminal in addition to a first sequential circuit having a positive-logic input terminal and a positive-logic non-inverted output terminal and a second sequential circuit having a positive-logic input terminal and a positive-logic inverted output terminal.

According to the logic design program, it is possible to easily implement a method for decreasing the number of gate stages by deleting redundant inverters disposed in the logic circuit including the series path of clock synchronous sequential circuits and combinational circuits.

[8] Deletion of Polarity Matching Inverter for Positive Logic, Replacement of First Sequential Circuit with Fourth Sequential Circuit In the logic design program according to item 7, in the case where a polarity matching inverter for positive logic can be disposed in a final stage of a combinational circuit coupled to a positive-logic input terminal of the first sequential circuit, the optimization processing includes processing for deleting the polarity matching inverter and replacing the first sequential circuit with the fourth sequential circuit.

This can contribute to a decrease in the number of gate stages in the critical path by deleting the polarity matching inverter for positive logic.

[9] Number of Gate Stages in Fourth Sequential Circuit is Smaller than Number of Gate Stages in First Sequential Circuit In the logic design program according to item 8, the number of gate stages in the second sequential circuit is smaller by one than the number of gate stages in the first sequential circuit, the number of gate stages in the fourth sequential circuit is smaller by one than the number of gate stages in the first sequential circuit, the number of gate stages in the second sequential circuit is smaller by one than the number of gate stages in the third sequential circuit, and the number of gate stages in the fourth sequential circuit is smaller by one than the number of gate stages in the third sequential circuit.

This makes it possible to decrease the number of gate stages within the sequential circuit itself and thereby ease the constraints of the number of gate stages in the critical path in the series path.

[10] Deletion of Polarity Matching Inverter for Positive Logic, Replacement of Second Sequential Circuit with Third Sequential Circuit In the logic design program according to item 7, in the case where a polarity matching inverter for positive logic can be disposed in a final stage of a combinational circuit coupled to a positive-logic input terminal of the second sequential circuit, the optimization processing includes processing for deleting the polarity matching inverter and replacing the second sequential circuit with the third sequential circuit.

This can contribute to a decrease in the number of gate stages in the critical path by deleting the polarity matching inverter for positive logic.

[11] Number of Gate Stages in Third Sequential Circuit is Smaller than Number of Gate Stages in Second Sequential Circuit In the logic design program according to item 10, the number of gate stages in the first sequential circuit is smaller by one than the number of gate stages in the second sequential circuit, the number of gate stages in the third sequential circuit is smaller by one than the number of gate stages in the second sequential circuit, the number of gate stages in the first sequential circuit is smaller by one than the number of gate stages in the fourth sequential circuit, and the number of gate stages in the third sequential circuit is smaller by one than the number of gate stages in the fourth sequential circuit.

This makes it possible to decrease the number of gate stages within the sequential circuit itself and thereby ease the constraints of the number of gate stages in the critical path in the series path.

[12] Storage of First to Fourth Sequential Circuits as Separate Components

In the logic design program according to item 7, the optimization processing reads and uses the first sequential circuit, the second sequential circuit, the third sequential circuit, and the fourth sequential circuit as separate components from the cell library.

This makes it possible to easily obtain components of sequential circuits necessary for logic circuit design for deleting redundant inverters.

[13] LSI Including Sequential Circuit Having Positive-Logic Input Terminal and Sequential Circuit Having Negative-Logic Input Terminal A semiconductor integrated circuit (40) according to yet another embodiment of the invention has a logic circuit including a series path of a clock synchronous sequential circuit and a combinational circuit and performs data processing. The semiconductor integrated circuit has a first sequential circuit having a positive-logic input terminal and a positive-logic non-inverted output terminal, a second sequential circuit having a positive-logic input terminal and a positive-logic inverted output terminal, a third sequential circuit having a negative-logic input terminal and a negative-logic non-inverted output terminal, and a fourth sequential circuit having a negative-logic input terminal and a negative-logic inverted output terminal.

According to this, by replacing the first sequential circuit with the third sequential circuit as necessary, it is possible to delete, for example, one inverter from the circuit disposed in the input stage of the first sequential circuit. Alternatively, by replacing the second sequential circuit with the fourth sequential circuit, it is possible to delete, for example, one inverter from the circuit disposed in the input stage of the second sequential circuit. Therefore, it is possible to decrease the number of gate stages by deleting redundant inverters disposed in the logic circuit including the series path of clock synchronous sequential circuits and combinational circuits.

[14] Third Sequential Circuit Coupled to Output of Negative-Logic Combinational Circuit In the semiconductor integrated circuit according to item 13, the series path includes a signal path through which the negative-logic input terminal of the third sequential circuit receives an output of a negative-logic combinational circuit.

This eliminates a logic matching inverter for positive logic necessary in the case where the first sequential circuit receives the output of the negative-logic combinational circuit at its positive-logic input terminal.

[15] Fourth Sequential Circuit Coupled to Output of Negative-Logic Combinational Circuit In the semiconductor integrated circuit according to item 13, the series path includes a signal path through which the negative-logic input terminal of the fourth sequential circuit receives an output of a negative-logic combinational circuit.

This eliminates a logic matching inverter for positive logic necessary in the case where the second sequential circuit receives the output of the negative-logic combinational circuit at its positive-logic input terminal.

[16] Third Sequential Circuit Coupled to Output of Positive-Logic Combinational Circuit In the semiconductor integrated circuit according to item 13, the series path includes a signal path through which the negative-logic input terminal of the third sequential circuit receives an output of a positive-logic combinational circuit.

This eliminates a logic matching inverter for positive logic necessary for the output of the positive-logic combinational circuit which operates in response to a negative-logic signal.

[17] Fourth Sequential Circuit Coupled to Output of Positive-Logic Combinational Circuit In the semiconductor integrated circuit according to item 13, the series path includes a signal path through which the negative-logic input terminal of the fourth sequential circuit receives an output of a positive-logic combinational circuit.

This eliminates a logic matching inverter for positive logic necessary for the output of the positive-logic combinational circuit which operates in response to a negative-logic signal.

2. Details of Embodiments

Embodiments will be described in greater detail below.

First Embodiment

A logic circuit design method according to this embodiment is a method in which a computer device such as an EWS (Engineering Workstation) for executing a logic synthesis program performs logic synthesis using hardware description and components in a cell library and generates a net list of a logic circuit including a series path of a clock synchronous sequential circuit and a combinational circuit. In this method, a third sequential circuit FF3 having a negative-logic input terminal and a negative-logic non-inverted output terminal and a fourth sequential circuit FF4 having a negative-logic input terminal and a negative-logic inverted output terminal in addition to a first sequential circuit FF1 having a positive-logic input terminal and a positive-logic non-inverted output terminal and a second sequential circuit FF2 having a positive-logic input terminal and a positive-logic inverted output terminal are used to configure the series path of the sequential circuit and the combinational circuit, as typically shown in a series path DPS2 in FIG. 1. Sequential circuits to be used in the series path are determined by optimization processing for decreasing the number of gate stages in the critical path between sequential circuits in the series path. For example, in the case where a combinational circuit CMBL is a negative-logic circuit in a series path DPS1 typically shown in FIG. 1, if the first sequential circuit FF1 or the second sequential circuit FF2 is used to receive the negative-logic output of the combinational circuit, it is necessary to dispose a logic matching inverter INV at the preceding stage of the sequential circuit because the input/output terminals of the sequential circuit are positive-logic terminals. In such a case, if the third sequential circuit FF3 or the fourth sequential circuit FF4 is used to receive the negative-logic output of the negative-logic combinational circuit as illustrated in the series path in FIG. 1, it is possible to eliminate the logic matching inverter INV because the input/output terminals of the sequential circuit are defined as negative-logic terminals.

Here, specific examples of the first sequential circuit FF1 and the second sequential circuit FF2 as positive-logic sequential circuits and the third sequential circuit FF3 and the fourth sequential circuit FF4 as negative-logic sequential circuits will be described with reference to FIGS. 2 to 6. The sequential circuits will be described by way of example of delay-type sequential circuits (flip-flops) having master-slave configuration.

Figure 2:
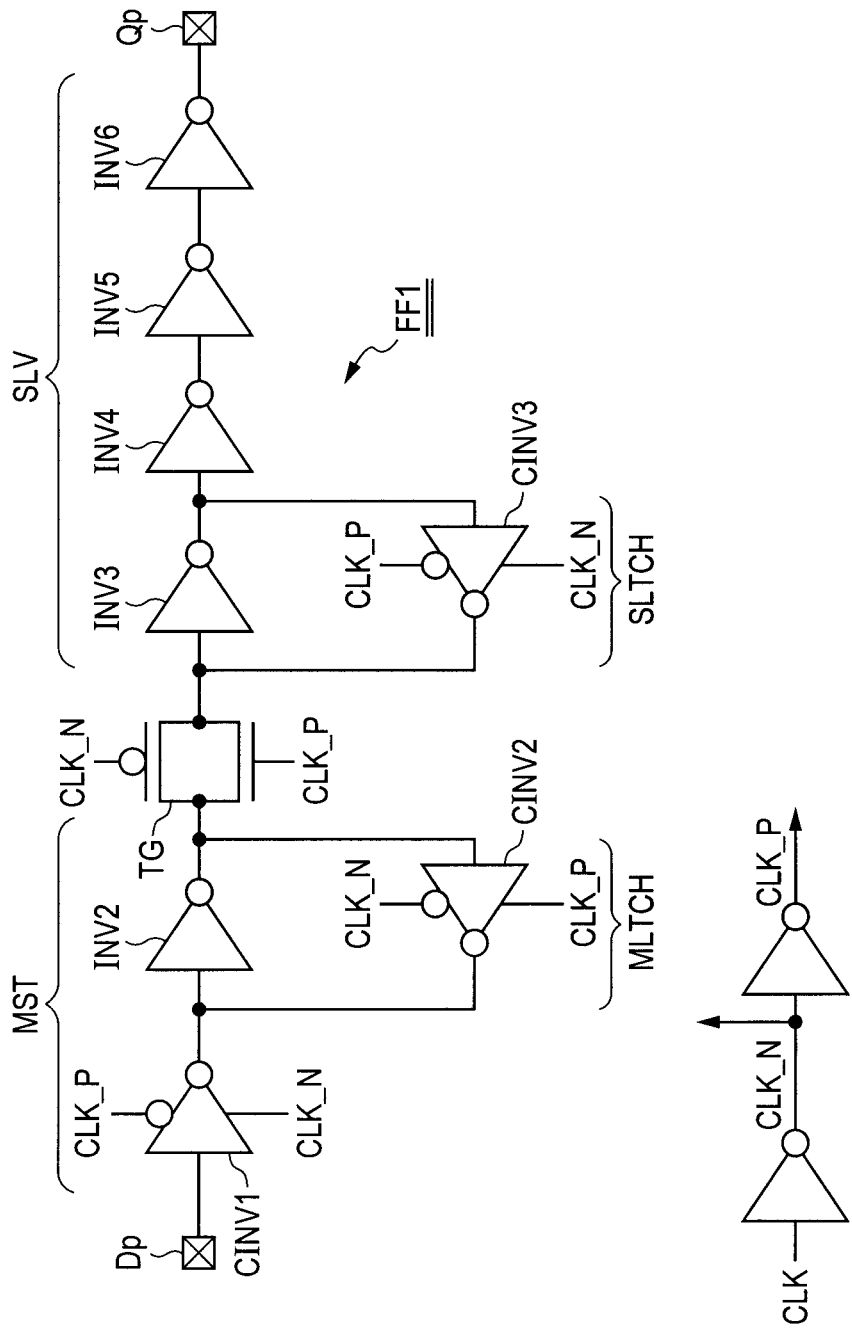
FIG. 2 is a logic circuit diagram showing an example of a first sequential circuit.

FIG. 2 shows an example of the first sequential circuit FF1. The first sequential circuit FF1 has a positive-logic input terminal Dp and a positive-logic non-inverted output terminal Qp between which a master stage MST and a slave stage SLV are disposed separated by a CMOS transfer gate TG. In the master stage MST, a master latch MLTCH is series-coupled to a clocked inverter CINV1 configuring an input gate. In the master latch MLTCH, an inverter INV2 and a clocked inverter CINV2 are inverse-parallel coupled. In the slave stage SLV, three inverters INV4, INV5, and INV6 are series-coupled to a slave latch SLTCH configured by inverse-parallel coupling an inverter INV3 and a clocked inverter CINV3. The inverter INV4 performs waveform shaping, the inverter INV6 performs external output, and the inverter INV5 is an inverter for non-inverted output.

Although the inverters INV4 and INV5 can be deleted if the output inverter INV6 has the function of shaping the output waveform of the slave latch SLTCH, there is required a waveform shaping inverter INV4 besides the output inverter INV6 in the configuration examples of FIGS. 2 to 6.

Figure 3:
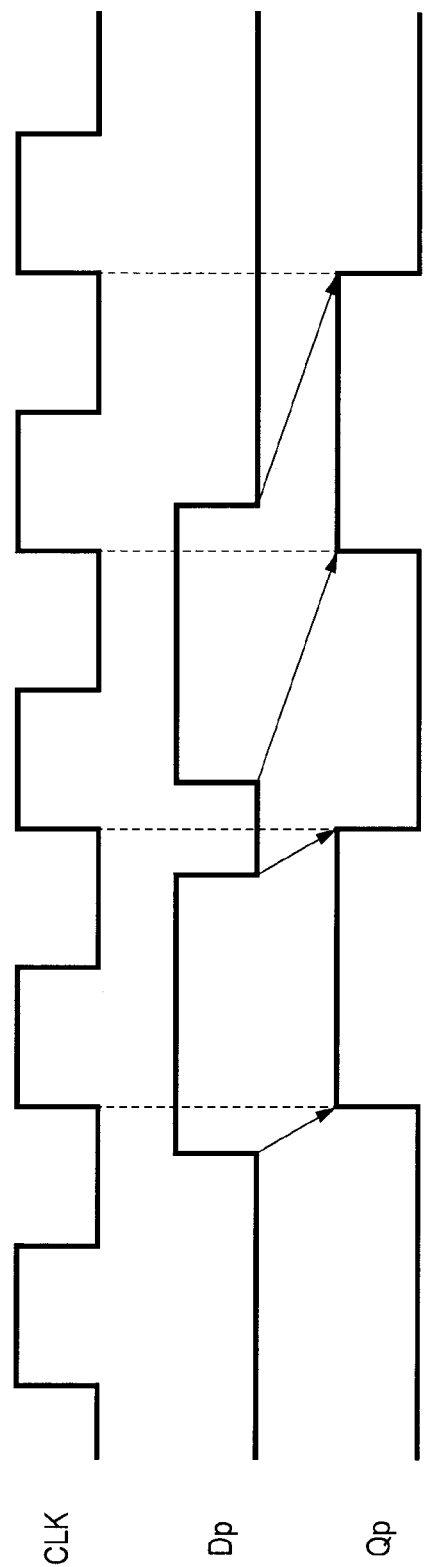
FIG. 3 is an operation explanation diagram of the first sequential circuit.

In the first sequential circuit FF1, the clocked inverters CINV1 and CINV3 are controlled by two-phase clock signals composed of an inverted clock signal CLK_N and a non-inverted clock signal CLK_P of a clock signal CLK, and controlled to a high-impedance state by the high level of the clock signal CLK and to an output-enabled state by the low level of the clock signal CLK. The clocked inverter CINV2 is controlled by the two-phase clock signals composed of the inverted clock signal CLK_N and the non-inverted clock signal CLK_P of the clock signal CLK, and controlled to a high-impedance state by the low level of the clock signal CLK and to an output-enabled state by the high level of the clock signal CLK. The CMOS transfer gate TG is controlled by the two-phase clock signals composed of the inverted clock signal CLK_N and the non-inverted clock signal CLK_P of the clock signal CLK, and controlled to an off state by the low level of the clock signal CLK and to an on state by the high level of the clock signal CLK. Therefore, as illustrated in FIG. 3, the first sequential circuit FF1 captures the value of the positive-logic input terminal Dp at the rising edge of the clock signal CLK, and changes the value of the positive-logic non-inverted output terminal Qp.

Figure 4:
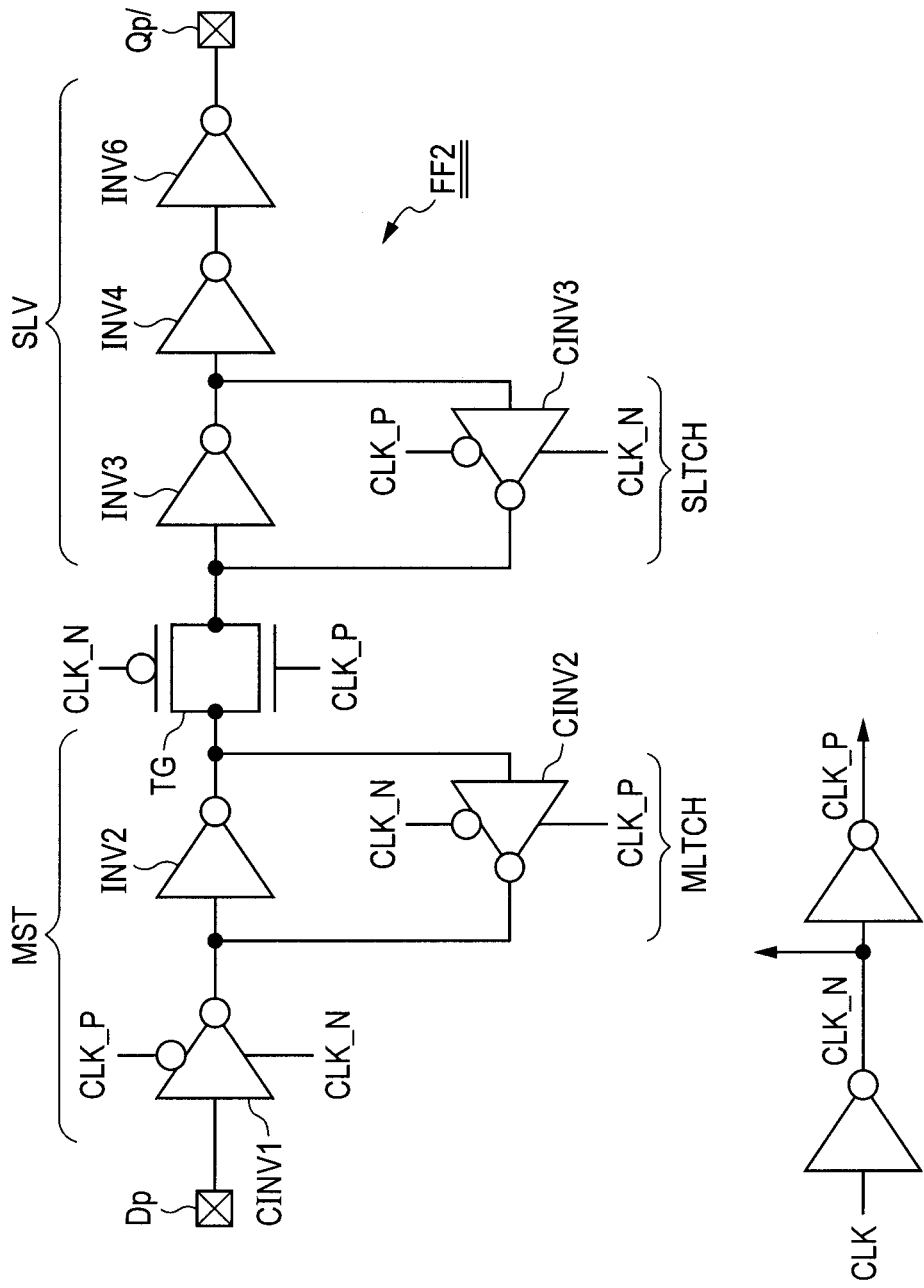
FIG. 4 is a logic circuit diagram showing an example of a second sequential circuit.

FIG. 4 shows an example of the second sequential circuit FF2. The second sequential circuit FF2 has a positive-logic input terminal Dp and a positive-logic inverted output terminal Qp/ and does not include the inverter INV5 at the subsequent stage of the waveform shaping inverter INV4 in the slave stage SLV, and the other configuration is the same as in FIG. 2. The same circuits are denoted by the same reference numerals, and detailed description thereof is omitted. The second sequential circuit FF2 captures the value of the positive-logic input terminal Dp at the rising edge of the clock signal CLK, and changes the value of the positive-logic inverted output terminal Qp/ to the inverted logic value. In the second sequential circuit FF2, inversion operations are fewer by one than in the first sequential circuit FF1, which leads to faster output establishment.

Figure 5:
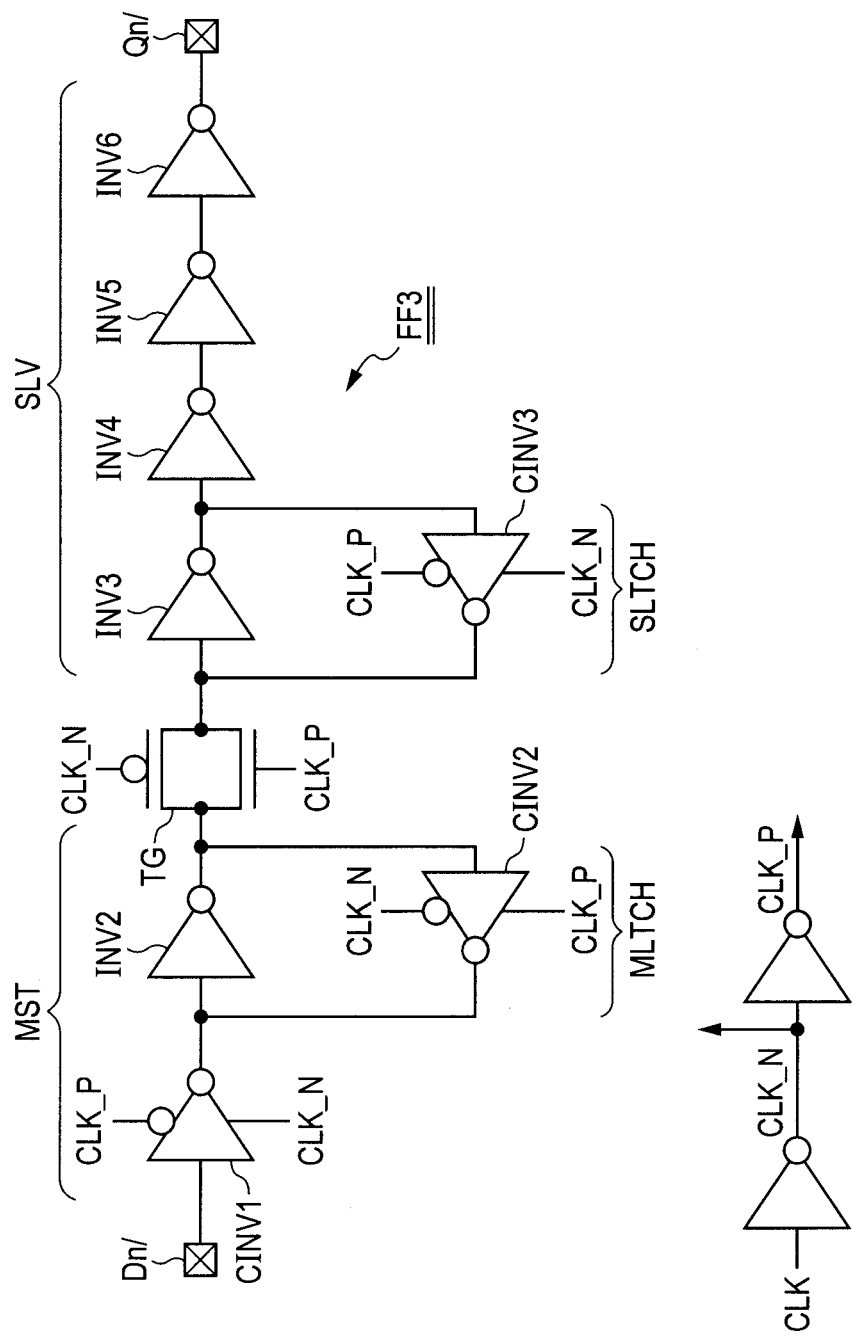
FIG. 5 is a logic circuit diagram showing an example of a third sequential circuit.

FIG. 5 shows an example of the third sequential circuit FF3. The third sequential circuit FF3 has a negative-logic input terminal Dn/ and a negative-logic non-inverted output terminal Qn/, and the other configuration is the same as in FIG. 2. The same circuits are denoted by the same reference numerals, and detailed description thereof is omitted. That is, the first and third sequential circuits FF1 and FF3 differ in that a positive logic signal, for example, a high level signal of a logic value 1 or a low level signal of a logic value 0 is supplied to the positive-logic input terminal Dp of the first sequential circuit FF1, whereas a negative logic signal, for example, a low level signal of the logic value 1 or a high level signal of the logic value 0 is supplied to the negative-logic input terminal Dn/ of the third sequential circuit FF3. The same applies to the relationship between the positive-logic non-inverted output terminal and the negative-logic non-inverted output terminal. That is, the first and third sequential circuits FF1 and FF3 differ in that a positive logic signal, for example, a high level signal of the logic value 1 or a low level signal of the logic value 0 is outputted to the positive-logic non-inverted output terminal Qp of the first sequential circuit FF1, whereas a negative logic signal, for example, a low level signal of the logic value 1 or a high level signal of the logic value 0 is outputted to the negative-logic non-inverted output terminal Qn/ of the third sequential circuit FF3. The third sequential circuit FF3 captures the value of the negative-logic input terminal Dn/ at the rising edge of the clock signal CLK, and changes the value of the negative-logic non-inverted output terminal Qn/ to the non-inverted logic value.

Figure 6:
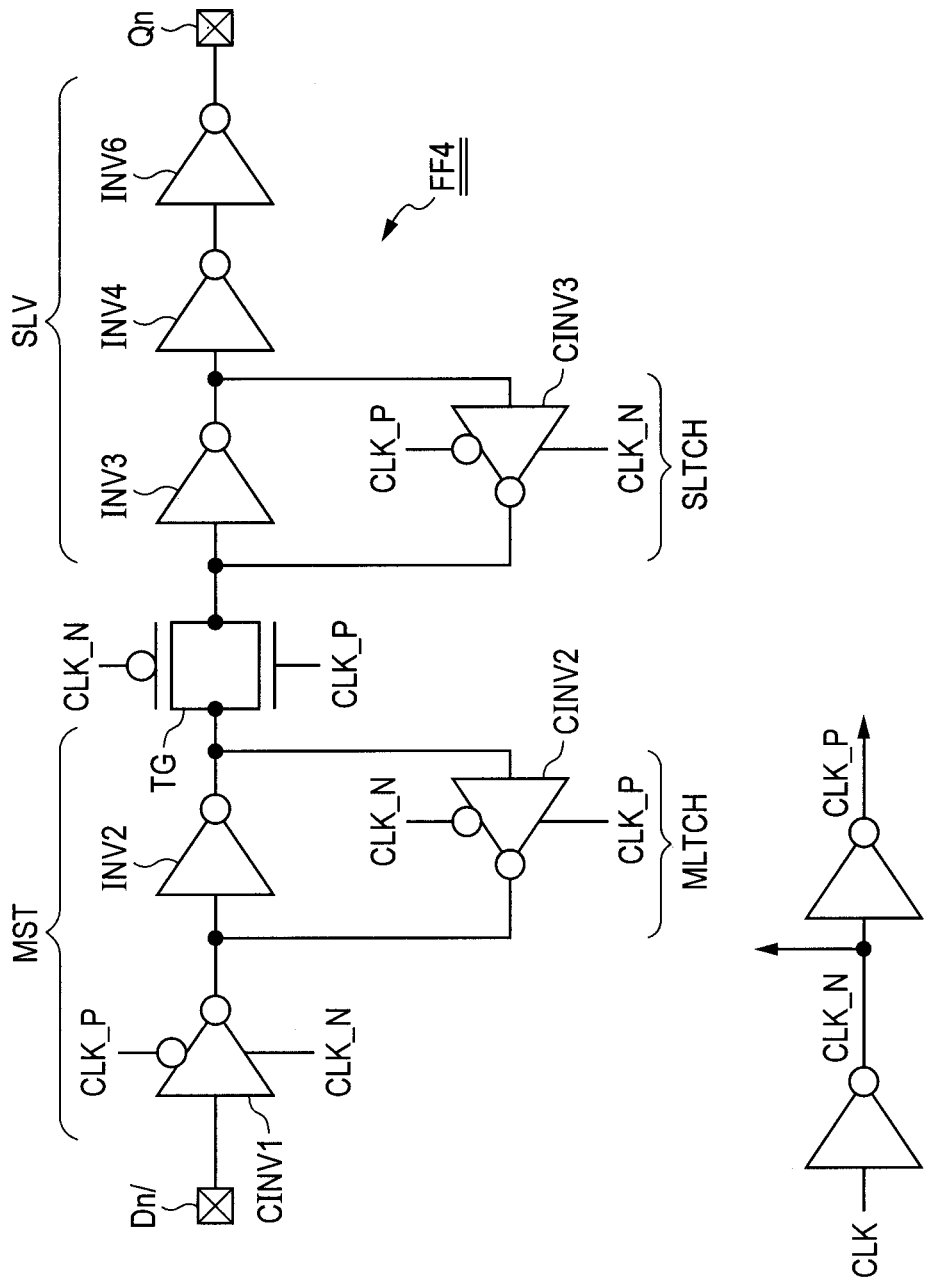
FIG. 6 is a logic circuit diagram showing an example of a fourth sequential circuit.

FIG. 6 shows an example of the fourth sequential circuit FF4. The fourth sequential circuit FF4 has a negative-logic input terminal Dn/ and a negative-logic inverted output terminal Qn, and the other configuration is the same as in FIG. 4. The same circuits are denoted by the same reference numerals, and detailed description thereof is omitted. That is, the second and fourth sequential circuits FF2 and FF4 differ in that a positive logic signal, for example, a high level signal of the logic value 1 or a low level signal of the logic value 0 is supplied to the positive-logic input terminal Dp of the second sequential circuit FF2, whereas a negative logic signal, for example, a low level signal of the logic value 1 or a high level signal of the logic value 0 is supplied to the negative-logic input terminal Dn/ of the fourth sequential circuit FF4. The same applies to the relationship between the positive-logic inverted output terminal and the negative-logic inverted output terminal. That is, the second and fourth sequential circuits FF2 and FF4 differ in that a positive logic signal, for example, a high level signal of the logic value 1 or a low level signal of the logic value 0 is outputted to the positive-logic inverted output terminal Qp/of the second sequential circuit FF2, whereas a negative logic signal, for example, a low level signal of the logic value 1 or a high level signal of the logic value 0 is outputted to the negative-logic inverted output terminal Qn of the fourth sequential circuit FF4. The fourth sequential circuit FF4 captures the value of the negative-logic input terminal Dn/ at the rising edge of the clock signal CLK, and changes the value of the negative-logic inverted output terminal Qn to the inverted logic value. In the fourth sequential circuit FF4, inversion operations are fewer by one than in the third sequential circuit FF3, which leads to faster output establishment.

Figure 7:
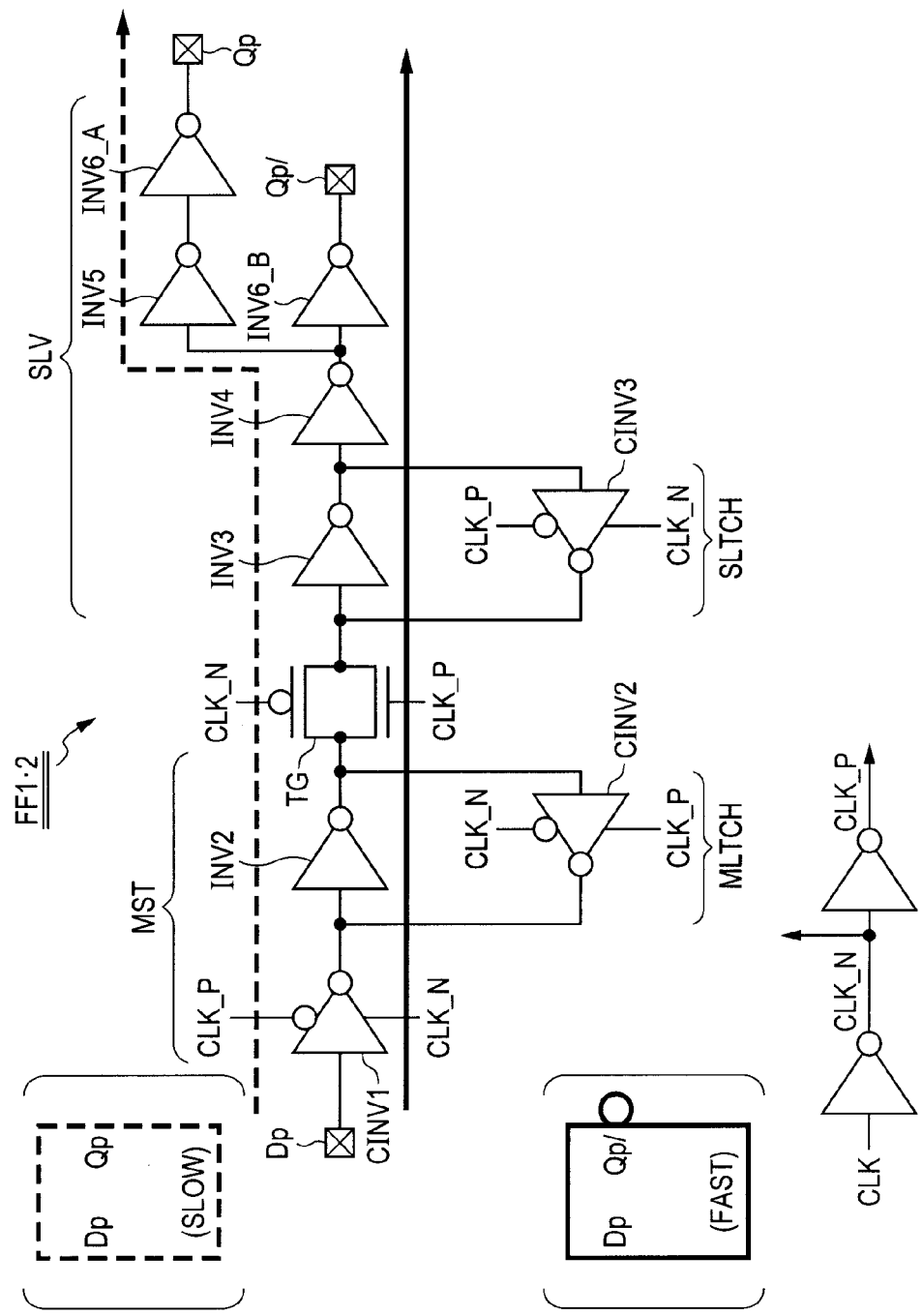
FIG. 7 is a logic circuit diagram showing another example of a positive-logic sequential circuit.

FIG. 7 shows another example of the positive-logic sequential circuit. A sequential circuit FF1/2 shown in FIG. 7 has a configuration in which the first sequential circuit FF1 and the second sequential circuit FF2 are unified, and has the positive-logic input terminal Dp, the positive-logic non-inverted output terminal Qp, and the positive-logic inverted output terminal Qp/. The master stage MST, the transfer gate TG, the slave latch SLTCH, and the waveform shaping inverter INV4 in FIGS. 2 and 4 are shared, an output inverter INV6_A is dedicated to non-inverted output, and an output inverter INV6_B is dedicated to inverted output. The sequential circuit FF1/2 is used to distribute an input from the positive-logic input terminal Dp to both the positive-logic non-inverted output terminal Qp and the positive-logic inverted output terminal Qp/. In this specification, the first sequential circuit FF1 refers to the sequential circuit FF1/2 using the positive-logic input terminal Dp and the positive-logic non-inverted output terminal Qp, and the second sequential circuit FF2 refers to, the sequential circuit FF1/2 using the positive-logic input terminal Dp and the positive-logic inverted output terminal Qp/.

Figure 8:
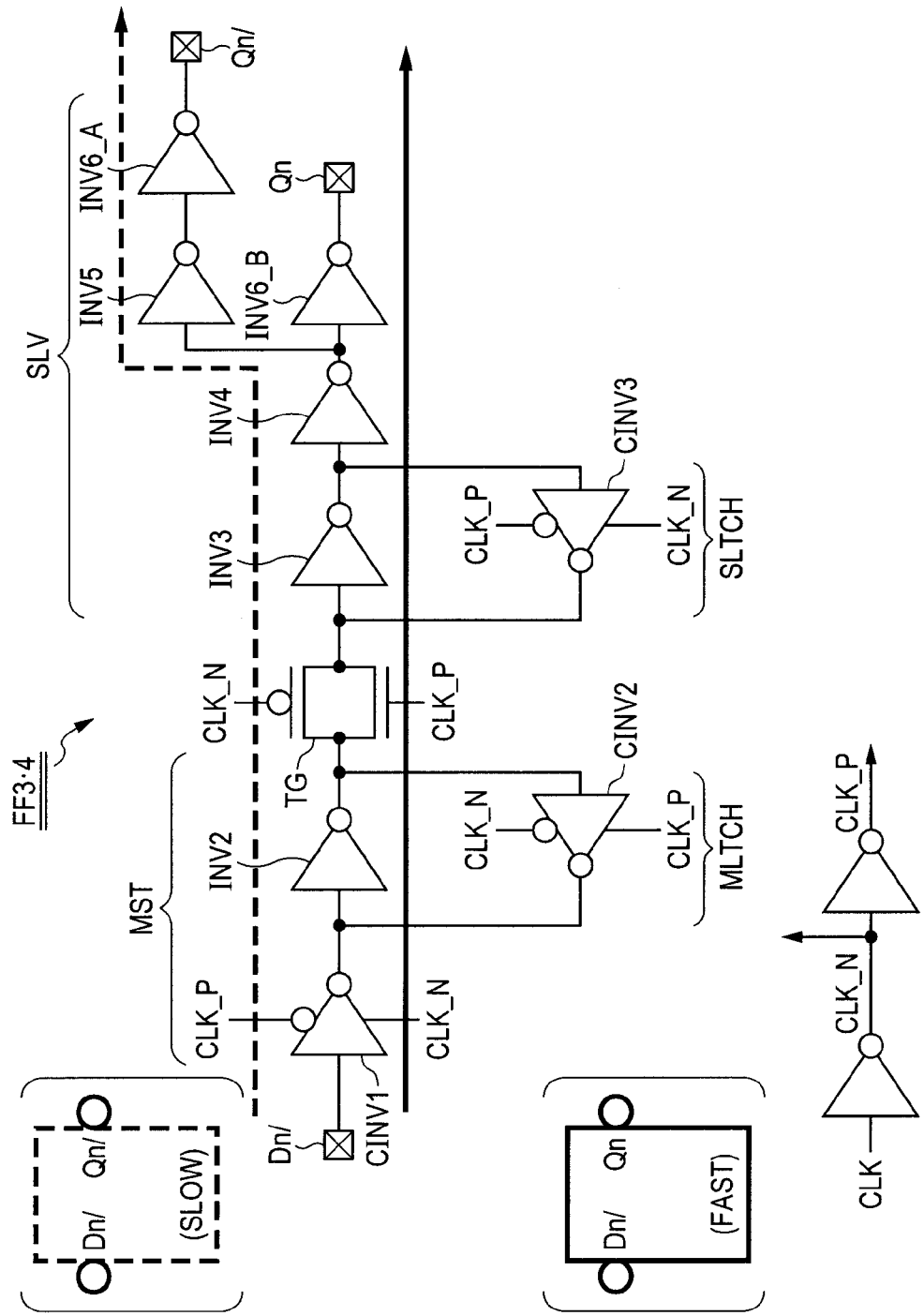
FIG. 8 is a logic circuit diagram showing another example of a negative-logic sequential circuit.

FIG. 8 shows another example of the negative-logic sequential circuit. A sequential circuit FF3/4 shown in FIG. 8 has a configuration in which the third sequential circuit FF3 and the fourth sequential circuit FF4 are unified, and has the negative-logic input terminal Dn/, the negative-logic non-inverted output terminal Qn/, and the negative-logic inverted output terminal Qn. The master stage MST, the transfer gate TG, the slave latch SLTCH, and the waveform shaping inverter INV4 in FIGS. 5 and 6 are shared, an output inverter INV6_A is dedicated to non-inverted output, and an output inverter INV6_B is dedicated to inverted output. The sequential circuit FF3/4 is used to distribute an input from the negative-logic input terminal Dn/ to both the negative-logic non-inverted output terminal Qn/ and the negative-logic inverted output terminal Qn. In this specification, the third sequential circuit FF3 refers to the sequential circuit FF3/4 using the negative-logic input terminal Dn/ and the negative-logic non-inverted output terminal Qn/, and the fourth sequential circuit FF4 refers to the sequential circuit FF3/4 using the negative-logic input terminal Dn/ and the negative-logic inverted output terminal Qn.

Figure 9:
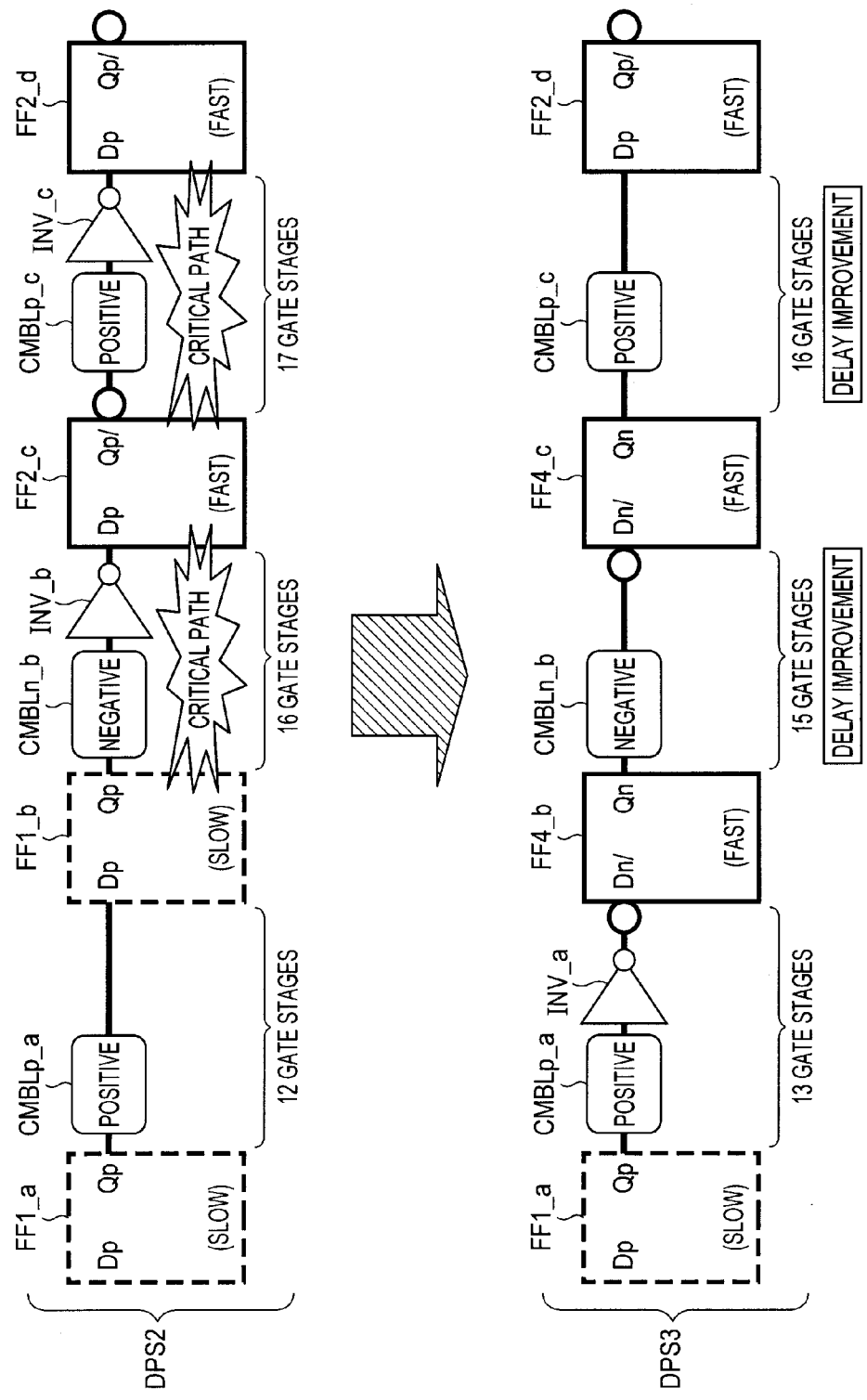
FIG. 9 is an explanation diagram showing a specific example of optimization processing in logic synthesis.

FIG. 9 shows a specific example of optimization processing in logic synthesis. In FIG. 9, with a series system containing a positive-logic combinational circuit CMBLp_a, a negative-logic combinational circuit CMBLn_b, and a positive-logic combinational circuit CMBLp_c, a series path DPS2 configured by adding only the positive-logic sequential circuits FF1, FF2 to these combinational circuits and a series path DPS3 configured by adding not only the positive-logic sequential circuits FF1, FF2 but also the negative-logic sequential circuits FF4 (FF3) to these combinational circuits are illustrated.

In the series path DPS2, a positive-logic sequential circuit FF1_a is disposed at the preceding stage of the positive-logic combinational circuit CMBLp_a, a positive-logic sequential circuit FF1_b is disposed at the subsequent stage of the positive-logic combinational circuit CMBLp_a, an inverter INV_b and a positive-logic sequential circuit FF2_c are disposed at the subsequent stage of the negative-logic combinational circuit CMBLn_b, and an inverter INV_c and a positive-logic sequential circuit FF2_d are disposed at the subsequent stage of the positive-logic combinational circuit CMBLp_c. The inverter INV_b functions as a logic matching inverter for supplying the negative-logic output of the negative-logic combinational circuit CMBLn_b to the positive-logic sequential circuit FF2_c. The inverter INV_c functions as a logic matching inverter for supplying the negative-logic output of the positive-logic combinational circuit CMBLp_c which performs a logic operation in response to an inverted signal to the positive-logic sequential circuit FF2_d.

In the series path DPS3, by replacing the positive-logic sequential circuits FF1_b and FF2_c with negative-logic sequential circuits FF4_b and FF4_c, deleting the inverters INV_b and INV_c, and adding a logic matching inverter INV_a at the subsequent stage of the positive-logic combinational circuit CMBLp_a, the number of gate stages in the series path is optimized. That is, by replacing the positive-logic sequential circuit FF1_b with the negative-logic sequential circuit FF4_b, the number of gate stages decreases by one. By adding the logic matching inverter INV_a so that the negative-logic sequential circuit FF4_b receives the output of the positive-logic combinational circuit CMBLp_a at its negative-logic input terminal, the number of gate stages increases by one. By replacing the positive-logic sequential circuit FF2_c with the negative-logic sequential circuit FF4_c, the number of gate stages decreases by one. By deleting the inverter INV_b because the negative-logic sequential circuit FF4_c can directly receive the negative-logic output of the negative-logic combinational circuit CMBLn_b at its negative-logic input terminal Dn/, the number of gate stages decreases by one. By deleting the inverter INV_c because the positive-logic combinational circuit CMBLp_c receives the negative-logic inverted signal outputted from the negative-logic sequential circuit FF4_c, the number of gate stages decreases by one. The logic value of a signal inputted to and outputted from the series path DPS3 matches the logic value of a signal inputted to and outputted from the series path DPS2. Therefore, according to the example of optimization by which the series path DPS2 is replaced with the series path DPS3, the total number of gate stages can be decreased by two, and 16 gate stages and 17 gate stages (critical paths) in the series path DPS2 are improved to 15 gate stages and 16 gate stages in the series path DPS3, respectively.

FIG. 10 shows another example of optimization processing in logic synthesis. In FIG. 10, with a series path containing a negative-logic combinational circuit CMBLn_a, a series path DPS4 configured by adding only the positive-logic sequential circuits FF1 to the combinational circuit and a series path DPS5 configured by adding not only the positive-logic sequential circuit FF1 but also the negative-logic sequential circuit FF4 to the combinational circuit are illustrated. In the series path DPS4, a positive-logic sequential circuit FF1_a is disposed at the preceding stage of the negative-logic combinational circuit CMBLn_a, and an inverter INV_a and a positive-logic sequential circuit FF1_b are disposed at the subsequent stage of the negative-logic combinational circuit CMBLn_a. The inverter INV_a functions as a logic matching inverter for supplying the negative-logic output of the negative-logic combinational circuit CMBLn_a to the positive-logic sequential circuit FF1_b.

In the series path DPS5, by replacing the positive-logic sequential circuit FF1_b with a negative-logic sequential circuit FF4_b and deleting the inverter INV_a, the number of gate stages in the series path is optimized. That is, by replacing the positive-logic sequential circuit FF1_b with the negative-logic sequential circuit FF4_b, the number of gate stages decreases by one. By deleting the inverter INV_a because the negative-logic sequential circuit FF4_b can directly receive the negative-logic output of the negative-logic combinational circuit CMBLn_a at its negative-logic input terminal Dn/, the number of gate stages decreases by one. The logic value of a signal inputted to and outputted from the series path DPS4 matches the logic value of a signal inputted to and outputted from the series path DPS5. Therefore, according to the example of optimization by which the series path DPS4 is replaced with the series path DPS5, the total number of gate stages can be decreased by two, one of which is due to the deletion of the logic matching inverter INV_a.

FIG. 11 shows yet another example of optimization processing in logic synthesis. In FIG. 11, with a series path containing a positive-logic combinational circuit CMBLp_a, a series path DPS6 configured by adding only the positive-logic sequential circuits FF1, FF2 to the combinational circuit and a series path DPS7 configured by adding not only the positive-logic sequential circuit FF1, FF2 but also the negative-logic sequential circuit FF4 to the combinational circuit are illustrated. In the series path DPS6, a positive-logic sequential circuit FF2_a is disposed at the preceding stage of the positive-logic combinational circuit CMBLp_a, and an inverter INV_a and a positive-logic sequential circuit FF1_b are disposed at the subsequent stage of the positive-logic combinational circuit CMBLp_a. The inverter INV_a functions as a logic matching inverter for supplying the inverted signal of a positive-logic output outputted from the positive-logic combinational circuit CMBLp_a to the positive-logic sequential circuit FF1_b.

In the series path DPS7, by replacing the positive-logic sequential circuit FF1_b with a negative-logic sequential circuit FF4_b and deleting the inverter INV_a, the number of gate stages in the series path is optimized. That is, by replacing the positive-logic sequential circuit FF1_b with the negative-logic sequential circuit FF4_b, the number of gate stages decreases by one. By deleting the inverter INV_a because the negative-logic sequential circuit FF4_b can directly receive the inverted output signal of the positive-logic combinational circuit CMBLp_a as a negative-logic signal at its negative-logic input terminal Dn/, the number of gate stages decreases by one. The logic value of a signal inputted to and outputted from the series path DPS6 matches the logic value of a signal inputted to and outputted from the series path DPS7. Therefore, according to the example of optimization by which the series path DPS6 is replaced with the series path DPS7, the total number of gate stages can be decreased by two, one of which is due to the deletion of the logic matching inverter INV_a.

Figure 12:
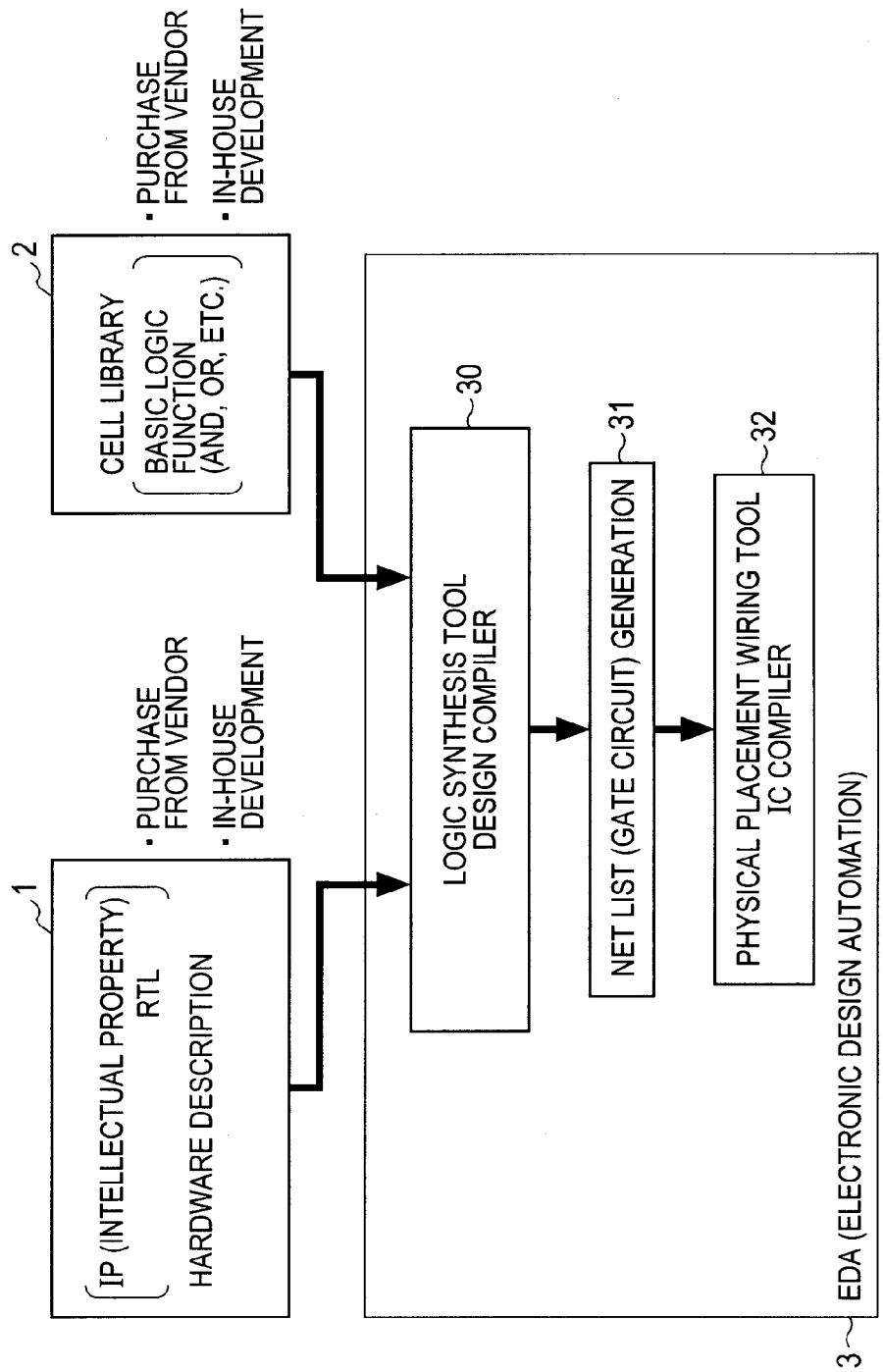
FIG. 12 is an explanation diagram illustrating a system configuration for implementing the logic circuit design method using the foregoing optimization processing.

FIG. 12 illustrates a system configuration for implementing a logic circuit design method using the above-described optimization processing.

Reference numeral 1 denotes hardware description in which the configuration of circuits subject to logic design such as a semiconductor integrated circuit or circuit modules for configuring the semiconductor integrated circuit is described in a specific hardware description language. An HDL (Hardware Description Language), an RTL (Register Transfer Level or Register Transfer Language), a C language, or the like is used as the specific language. The hardware description is provided as a so-called IP (Intellectual Property) module provided by a vendor of the manufacturing company, design company, sales company, or the like of the LSI (semiconductor integrated circuit). Alternatively, it can be developed in-house.

Reference numeral 2 denotes a cell library which is a component database storing various kinds of components as function data and pattern data for configuring basic logic circuits such as an AND gate, an OR gate, a NAND gate, a NOR gate, a clocked inverter, and an inverter. The cell library contains components of combinational circuits as well as sequential circuits which are not only positive-logic sequential circuits but also negative-logic sequential circuits as described above. In the case of the delay-type clock synchronous sequential circuit, the cell library separately contains the first sequential circuit FF1, the second sequential circuit FF2, the third sequential circuit FF3, and the fourth sequential circuit FF4 illustrated in FIGS. 2 to 8.

Reference numeral 3 denotes a computer device. The computer device 3 executes a logic synthesis tool 30 also called a design compiler and thereby generates a net list 31 of a logic circuit including a series path of a combinational circuit. Further, the computer device 3 executes a physical placement wiring tool 32 also called an IC compiler and thereby generates master pattern data, pattern printing data for electron beam printing, or the like by performing placement and wiring on the semiconductor integrated circuit or circuit modules mounted on the semiconductor integrated circuit based on the net list 31. In the above logic synthesis processing, the computer device performs optimization processing for decreasing the number of gate stages in the critical path between sequential circuits in the series path of clock synchronous sequential circuits and combinational circuits, using the third sequential circuit FF3 and the fourth sequential circuit FF4 in addition to the first sequential circuit FF1 and the second sequential circuit FF2.

In the case where a hardware module is provided as an IP module, the provider normally requires compliance with a provision for prohibiting any modification to ensure the circuit function produced based on the description, as a condition of providing the IP. Accordingly, in consideration of using the IP module under such a condition, to increase the functional reliability of circuits implemented by the IP module, it is generally better to use a cell library provided by a vendor who provides the logic synthesis tool. Accordingly, it can be considered that the result of logic synthesis performed by different semiconductor integrated circuit companies using the IP module of the same vendor and the cell library provided by the same vendor is the same. Components registered in the cell library also can be developed in-house. If the cell library storing such components is used for logic synthesis, even with the same IP module the result is not necessarily the same. The reason is as follows. The logic synthesis tool as the design compiler or the like can produce, in many ways, the configuration for implementing a function identified by hardware description, and originally has the optimization function of generating a net list optimized to satisfy compile conditions (parameters) such as an operation speed and a chip size provided to the logic synthesis tool. Accordingly, optimization is performed within the limits of the increased types of usable components; therefore, the result of the logic synthesis may be different. The optimization processing using the negative-logic sequential circuits FF3 and FF4 also can be performed depending thereon. This will be described in more detail with reference to FIG. 13.

Figure 13:
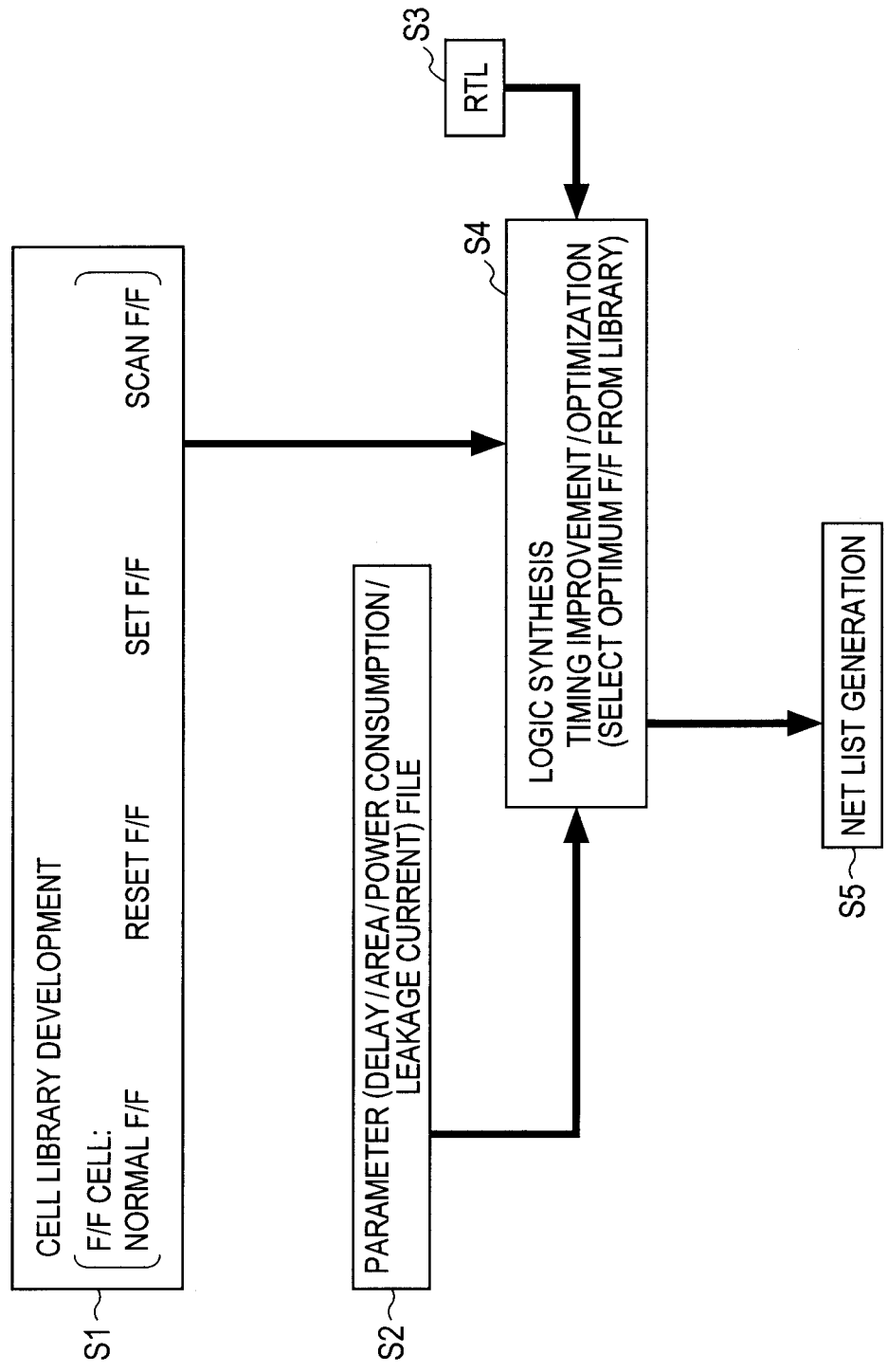
FIG. 13 is a flowchart illustrating a process flow of series-path optimization processing in logic synthesis with the negative-logic sequential circuits FF3 and FF4 added to components.

FIG. 13 illustrates a process flow of series-path optimization processing in logic synthesis with the negative-logic sequential circuits FF3 and FF4 added to components.

Figure 22:
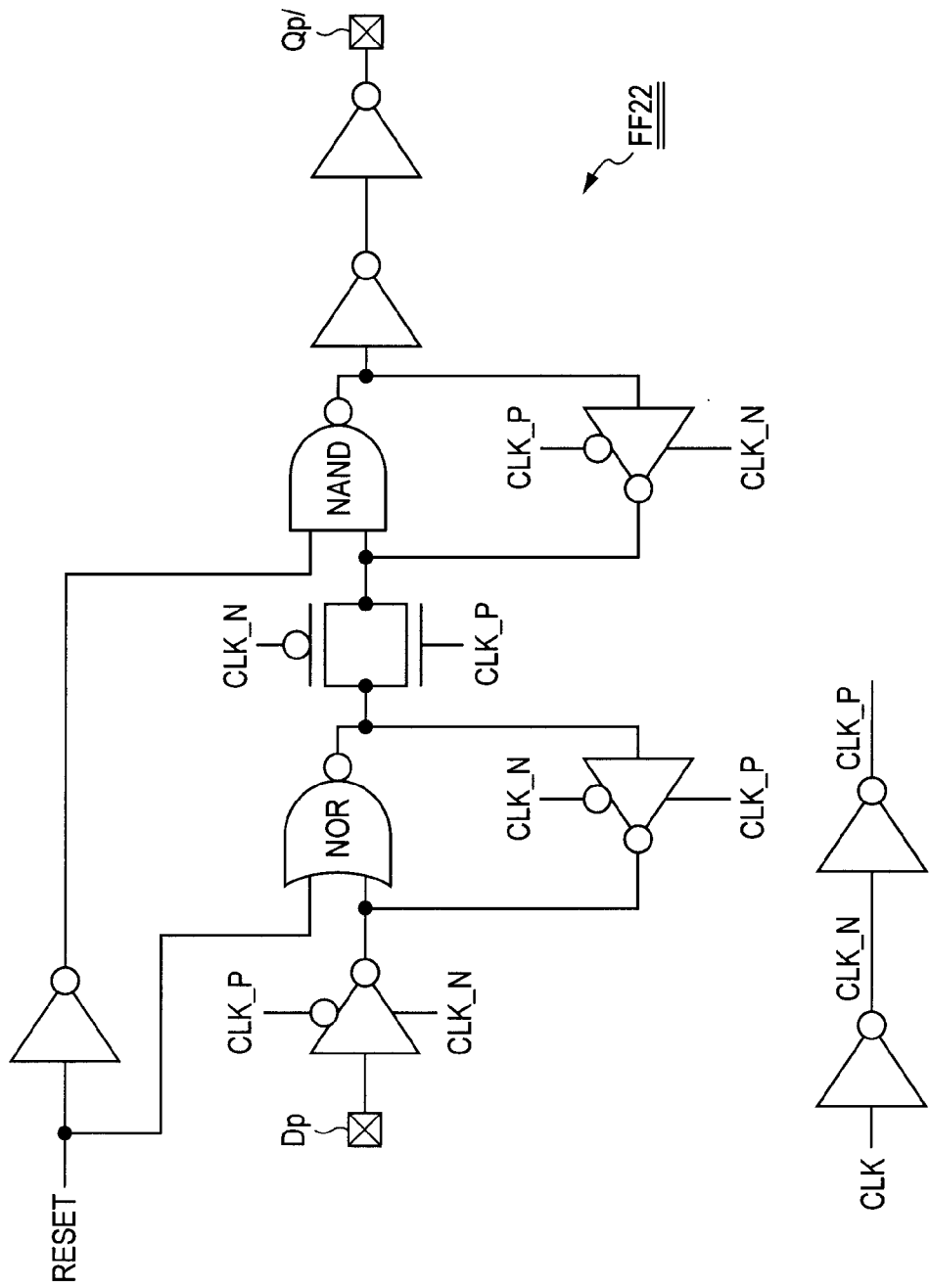
FIG. 22 is a logic circuit diagram illustrating a second sequential circuit with a reset function as another specific example of the sequential circuit.
Figure 23:
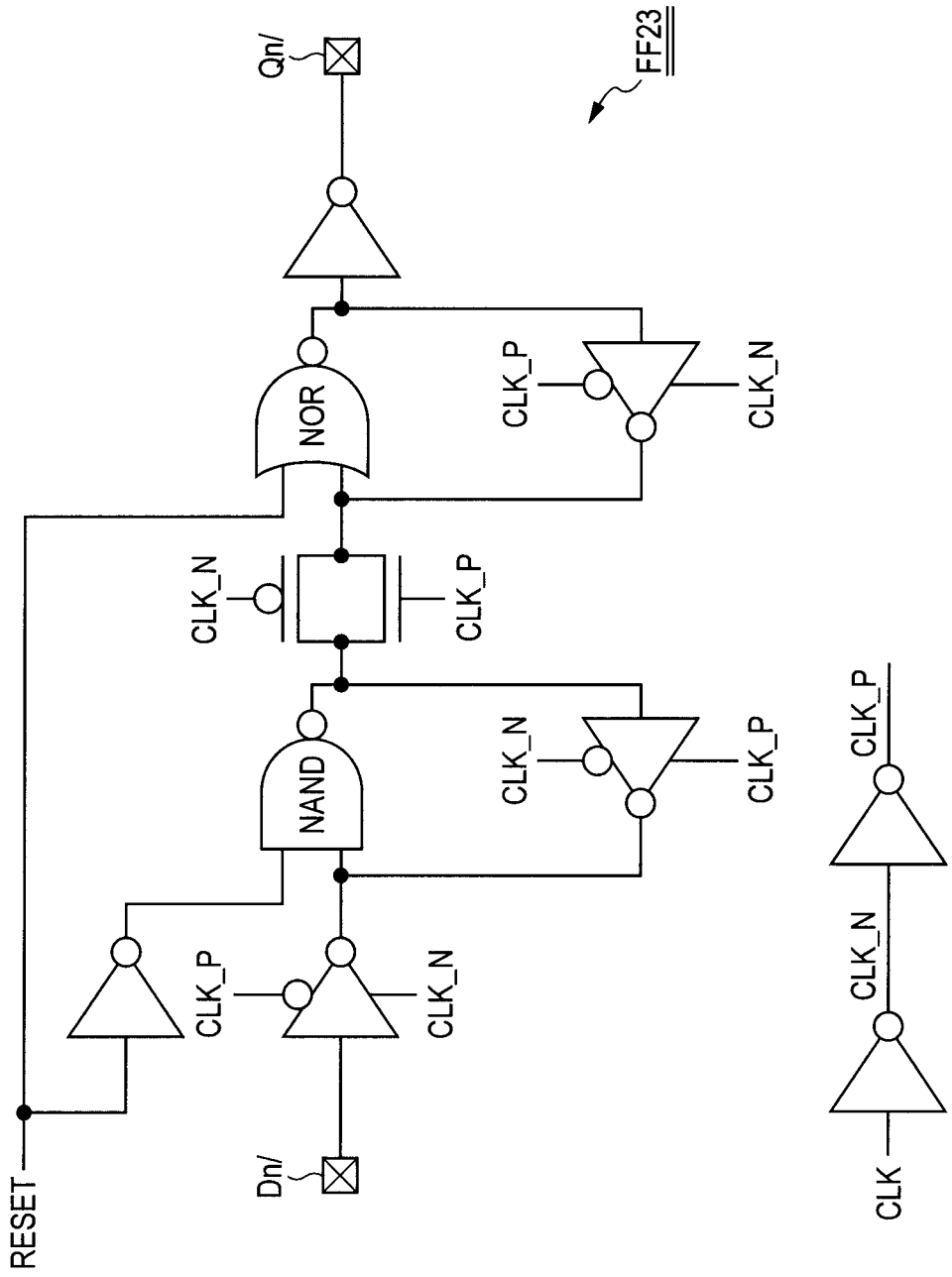
FIG. 23 is a logic circuit diagram illustrating a third sequential circuit with a reset function as another specific example of the sequential circuit.

Since in the past the negative-logic sequential circuits FF3 and FF4 are not provided as components in the cell library, the negative-logic sequential circuits FF3 and FF4 are added in the cell library, or the cell library having the negative-logic sequential circuits FF3 and FF4 is developed beforehand (S1). The type of the delay-type clock synchronous sequential circuit as well is not limited to the normal function illustrated in FIGS. 2 to 8, but extends into a reset function, a set function, a scan circuit function, and other various functions. Negative-logic sequential circuits are prepared for their respective functions. In this case, it is not necessary to prepare all circuits separately, and patterns shared between positive-logic and negative-logic sequential circuits and some functional description data can be formed in a shared data format. FIG. 22 illustrates a second sequential circuit FF22 with a reset function, and FIG. 23 illustrates a third sequential circuit FF23 with a reset function.

A parameter file describing the designation of an operation speed (or operation delay time), a chip area (or chip occupation area), power consumption, leakage power, and the like as conditions of logic synthesis is provided to the computer device 3 (S2).

In addition to the parameter file, hardware description in the RTL or the like is provided to the computer device 3, which performs logic synthesis in accordance with the hardware description, referring to the cell library (S4), and generates a net list (S5). In the logic synthesis in step S4, timing, a chip size, and the like are optimized in accordance with the priorities of given parameters. In the generation of the series path of combinational circuits and clock synchronous sequential circuits, optimization processing such as deleting logic matching inverters by using negative-logic sequential circuits as illustrated in FIGS. 9, 10 and 11 is performed in accordance with the priorities of the speed and the like. The processing is performed in accordance with control by a logic design program as the logic synthesis tool such as the design compiler executed by the computer device 3. The details of the control are described above, and repeated description thereof is omitted.

According to this embodiment, the following operational effects can be obtained.

(1) As illustrated in FIG. 9, by replacing the second sequential circuit FF2_c with the fourth sequential circuit FF4_c as necessary in the optimization processing, it is possible to delete, for example, the one inverter INV_b from the circuit disposed in the input stage of the second sequential circuit. Therefore, it is possible to decrease the number of gate stages by deleting redundant inverters disposed in the logic circuit including the series path of clock synchronous sequential circuits and combinational circuits.

(2) As illustrated in FIGS. 10 and 11, in the case where the polarity matching inverter INV_a for positive logic can be disposed in the final stage of the combinational circuit coupled to the positive-logic input terminal of the first sequential circuit FF1_b, the computer device 3 deletes the polarity matching inverter and replaces the first sequential circuit with the fourth sequential circuit FF4_b in the optimization processing. This can contribute to a decrease in the number of gate stages in the critical path by deleting the polarity matching inverter for positive logic.

(3) As illustrated in FIGS. 2 to 8, the number of gate stages in the second sequential circuit FF2 is smaller by one than the number of gate stages in the first sequential circuit FF1, the number of gate stages in the fourth sequential circuit FF4 is smaller by one than the number of gate stages in the first sequential circuit FF1, the number of gate stages in the second sequential circuit FF2 is smaller by one than the number of gate stages in the third sequential circuit FF3, and the number of gate stages in the fourth sequential circuit FF4 is smaller by one than the number of gate stages in the third sequential circuit FF3. This makes it possible to decrease the number of gate stages within the sequential circuit itself by replacing FF1 with FF4 in FIGS. 10 and 11 and thereby ease the constraints of the number of gate stages in the critical path in the series path.

Second Embodiment

While the sequential circuits FF1, FF2, FF3, and FF4 according to the first embodiment require the waveform shaping inverter INV4 besides the output inverter INV6, in the second embodiment the output inverter INV6 has the function of shaping the output waveform of the slave latch SLTCH, and description will made of sequential circuits FF11, FF12, FF13, and FF14 obtained by deleting the inverters INV4 and INV5 of FIGS. 2 to 6 accordingly.

Figure 14:
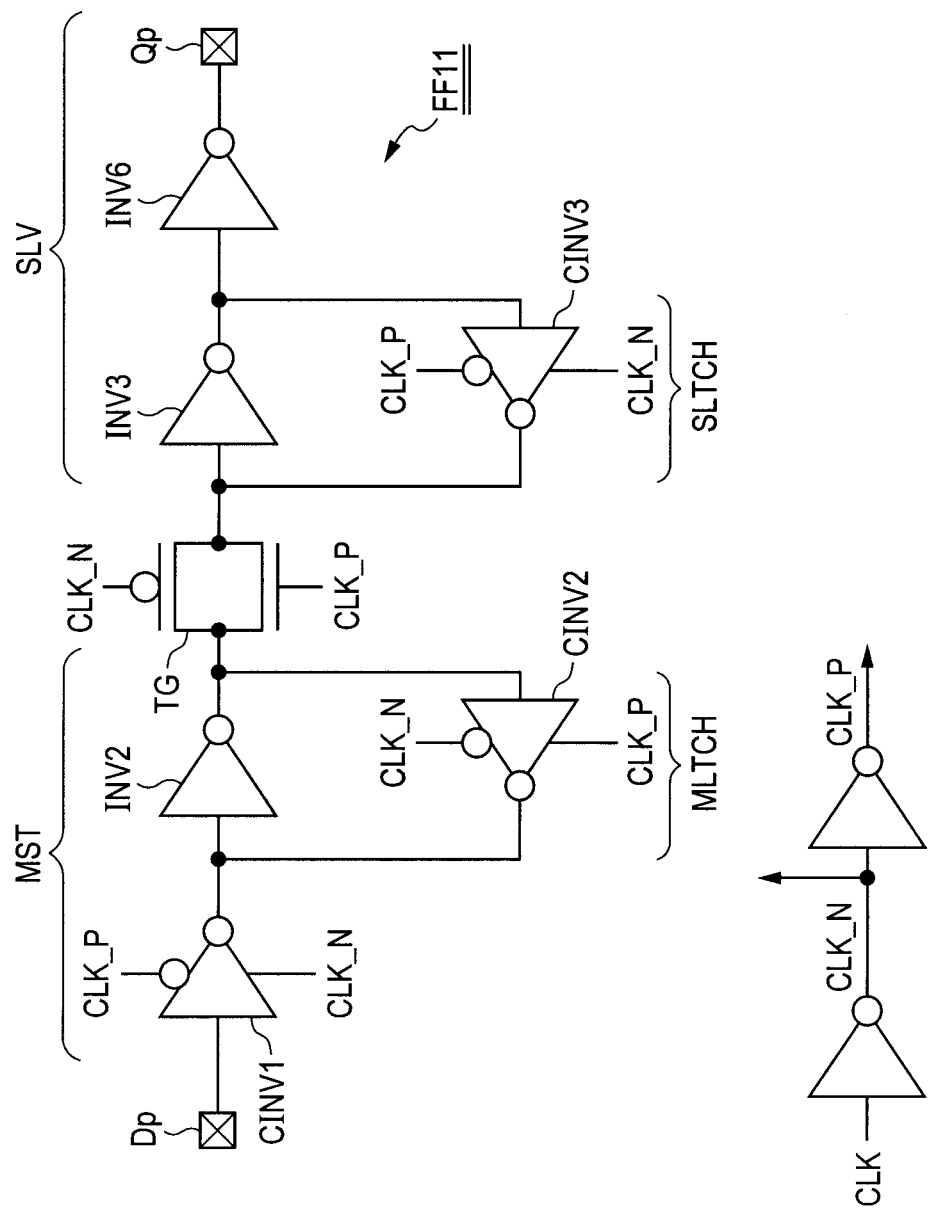
FIG. 14 is a logic circuit diagram illustrating a first sequential circuit having a positive-logic input terminal and a positive-logic non-inverted output terminal.

FIG. 14 illustrates a first sequential circuit FF11 having the positive-logic input terminal Dp and the positive-logic non-inverted output terminal Qp. This is configured by deleting the inverters INV4 and INV5 of FIG. 2, and the other configuration is the same as in FIG. 2. The same circuits are denoted by the same reference numerals, and detailed description thereof is omitted. The number of gate stages is smaller by two than in FIG. 2.

Figure 15:
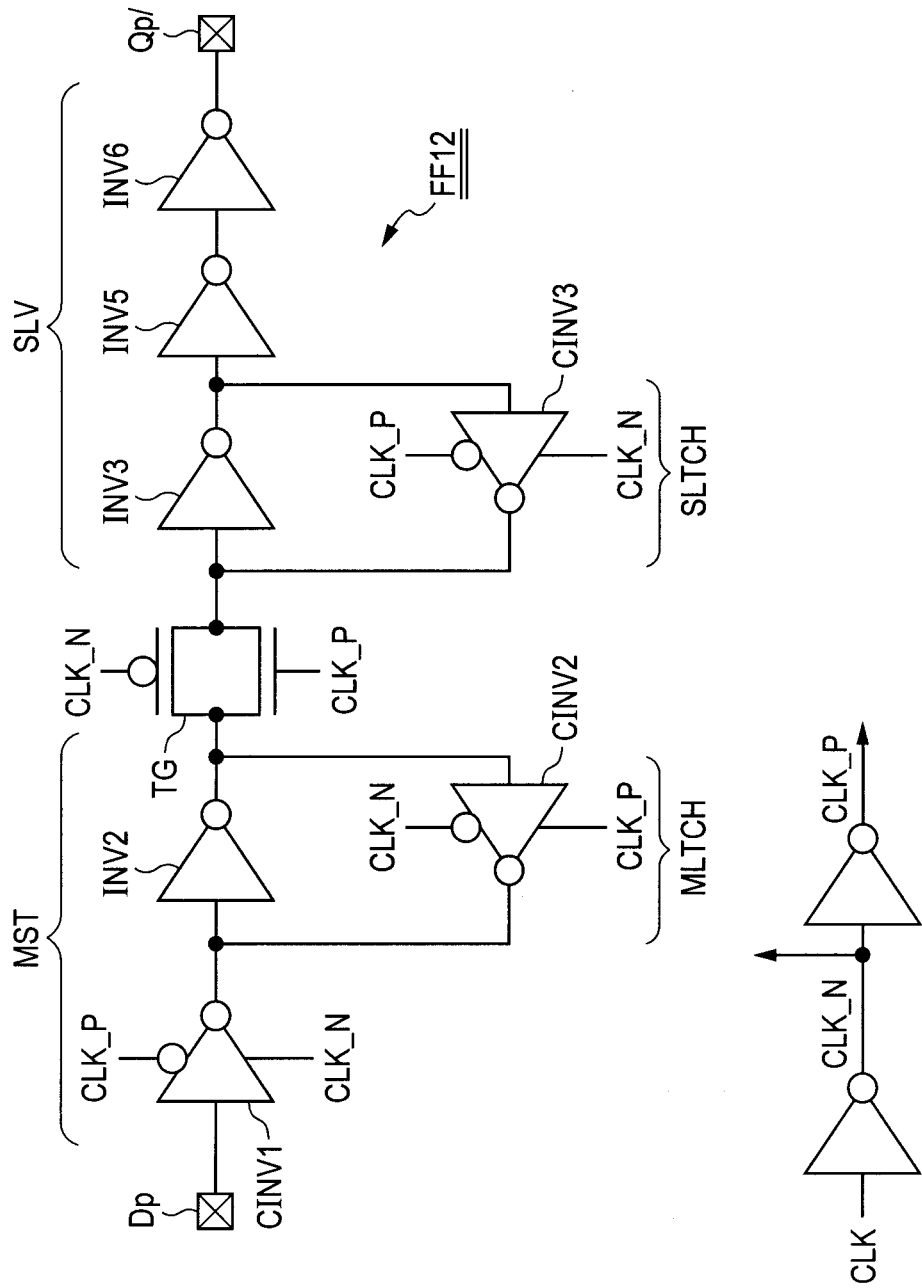
FIG. 15 is a logic circuit diagram illustrating a second sequential circuit having a positive-logic input terminal and a positive-logic inverted output terminal.

FIG. 15 illustrates a second sequential circuit FF12 having the positive-logic input terminal Dp and the positive-logic inverted output terminal Qp/. This is configured by replacing the inverter INV4 of FIG. 4 with the inverter INV5 for inverted output, and the other configuration is the same as in FIG. 4. The same circuits are denoted by the same reference numerals, and detailed description thereof is omitted. The number of gate stages is the same as in FIG. 4.

Figure 16:
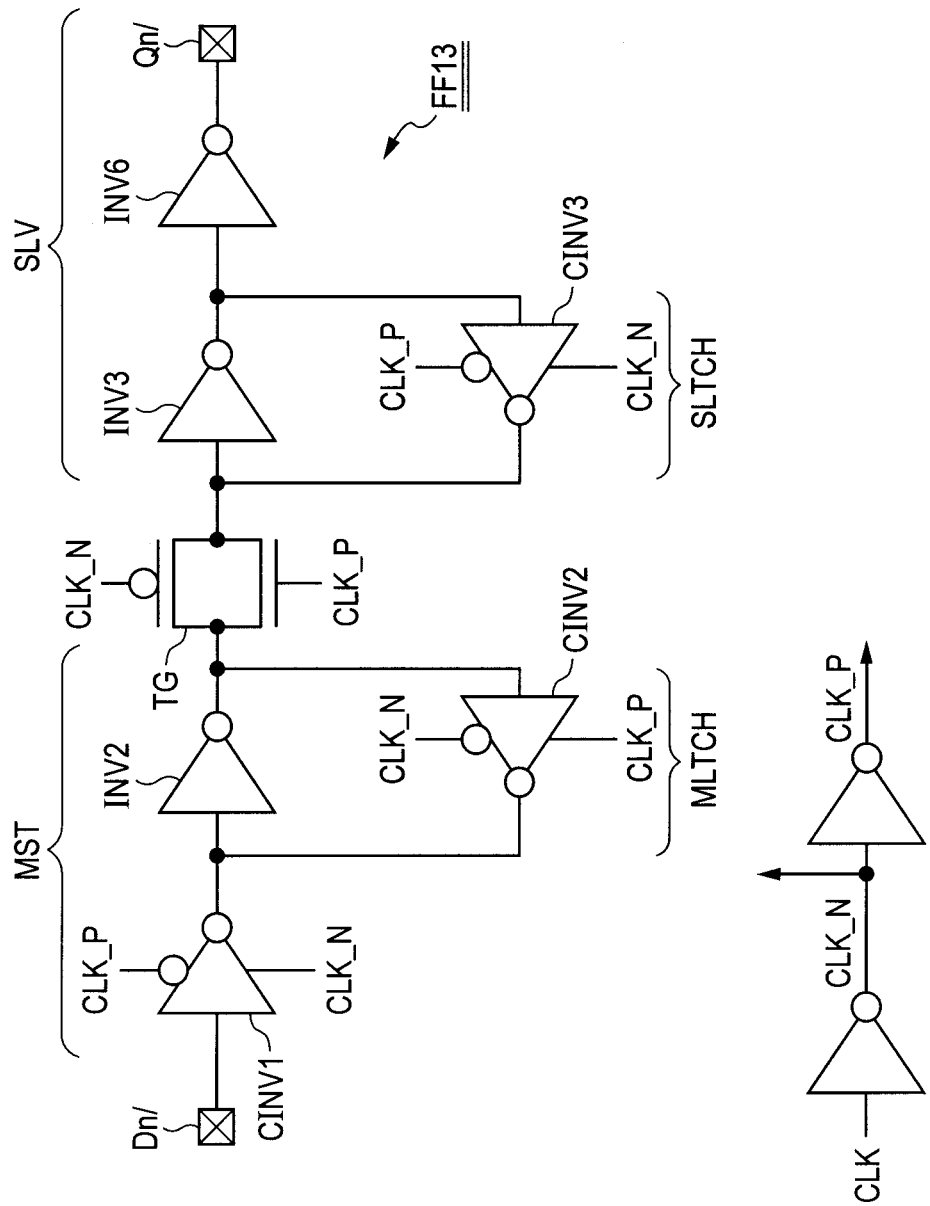
FIG. 16 is a logic circuit diagram illustrating a third sequential circuit having a negative-logic input terminal and a negative-logic non-inverted output terminal.

FIG. 16 illustrates a third sequential circuit FF13 having the negative-logic input terminal Dn/ and the negative-logic non-inverted output terminal Qn/. This is configured by deleting the inverters INV4 and INV5 of FIG. 5, and the other configuration is the same as in FIG. 5. The same circuits are denoted by the same reference numerals, and detailed description thereof is omitted. The number of gate stages is smaller by two than in FIG. 5.

Figure 17:
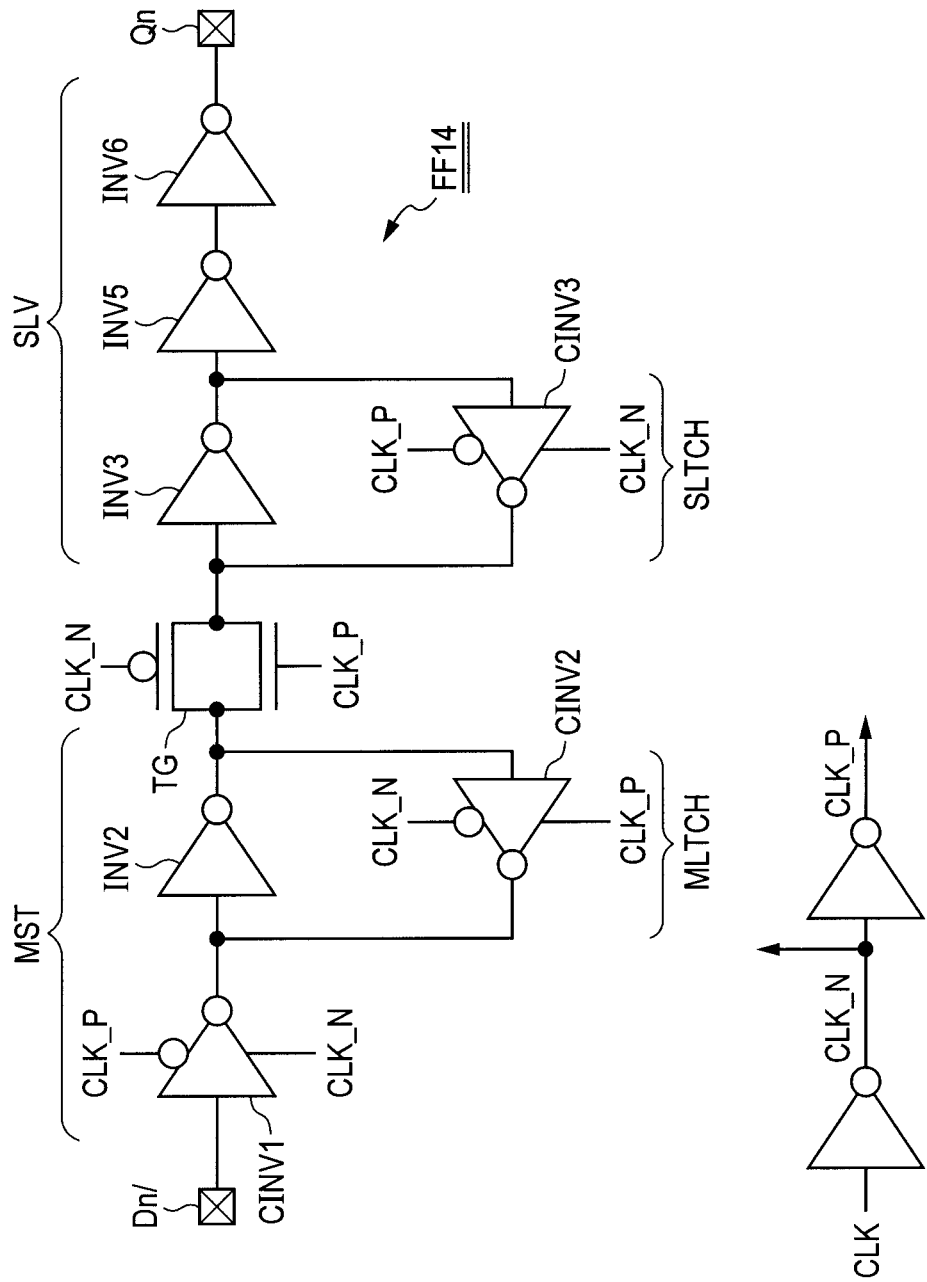
FIG. 17 is a logic circuit diagram illustrating a fourth sequential circuit having a negative-logic input terminal and a negative-logic inverted output terminal.

FIG. 17 illustrates a fourth sequential circuit FF14 having the negative-logic input terminal Dn/ and the negative-logic inverted output terminal Qn. This is configured by replacing the inverter INV4 of FIG. 6 with the inverter INV5 for inverted output, and the other configuration is the same as in FIG. 6. The same circuits are denoted by the same reference numerals, and detailed description thereof is omitted. The number of gate stages is the same as in FIG. 6.

Figure 18:
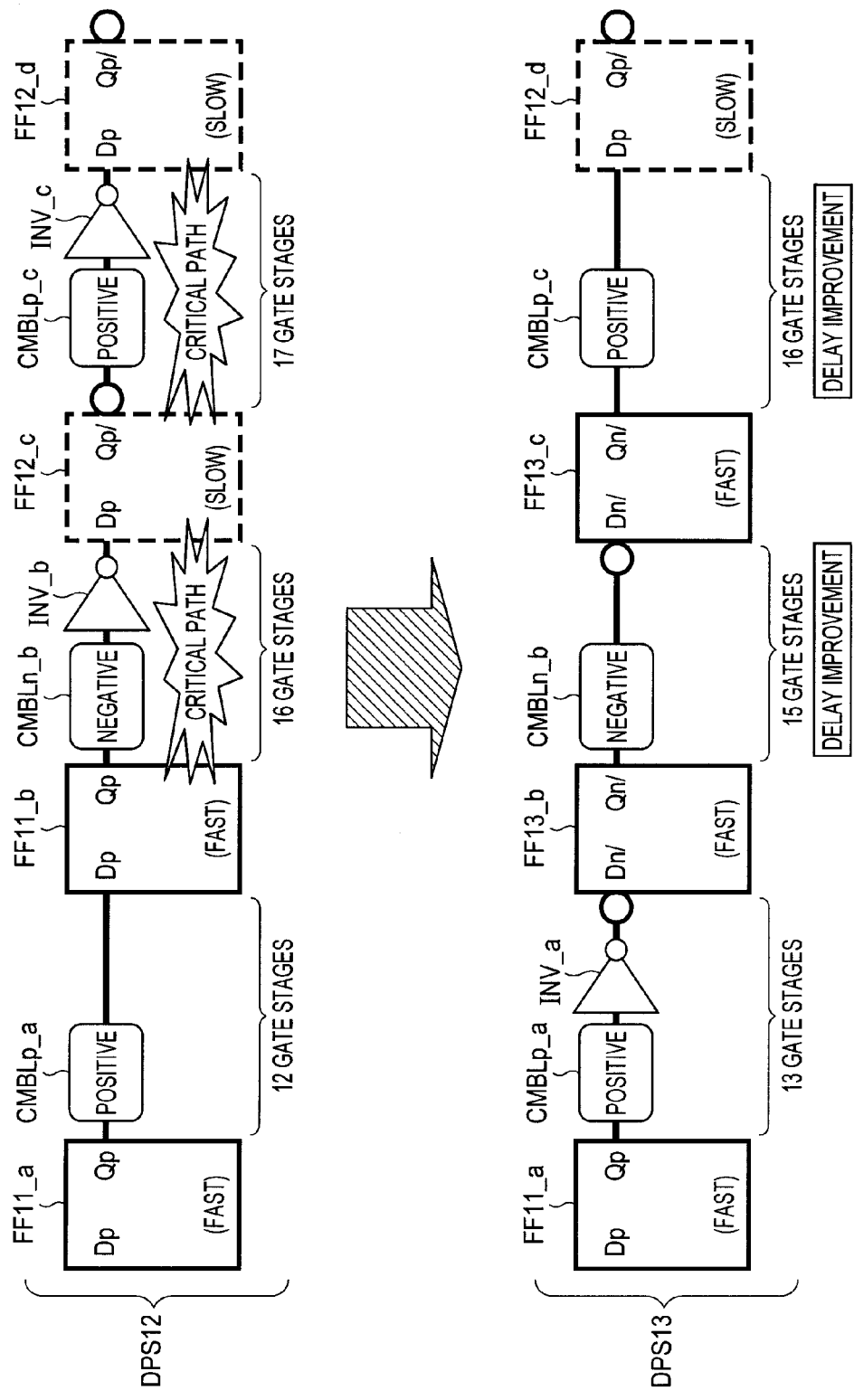
FIG. 18 is an explanation diagram showing a specific example of optimization processing in logic synthesis.

FIG. 18 shows a specific example of optimization processing in logic synthesis. In FIG. 18, with a series system containing a positive-logic combinational circuit CMBLp_a, a negative-logic combinational circuit CMBLn_b, and a positive-logic combinational circuit CMBLp_c, a series path DPS12 configured by adding only the positive-logic sequential circuits FF11, FF12 to these combinational circuits and a series path DPS13 configured by adding not only the positive-logic sequential circuits FF11, FF12 but also the negative-logic sequential circuits FF13 to these combinational circuits are illustrated.

In the series path DPS12, a positive-logic sequential circuit FF11_a is disposed at the preceding stage of the positive-logic combinational circuit CMBLp_a, a positive-logic sequential circuit FF11_b is disposed at the subsequent stage of the positive-logic combinational circuit CMBLp_a, an inverter INV_b and a positive-logic sequential circuit FF12_c are disposed at the subsequent stage of the negative-logic combinational circuit CMBLn_b, and an inverter INV_c and a positive-logic sequential circuit FF12_d are disposed at the subsequent stage of the positive-logic combinational circuit CMBLp_c. The inverter INV_b functions as a logic matching inverter for supplying the negative-logic output of the negative-logic combinational circuit CMBLn_b to the positive-logic sequential circuit FF12_c. The inverter INV_c functions as a logic matching inverter for supplying the negative-logic output of the positive-logic combinational circuit CMBLp_c which performs a logic operation in response to an inverted signal to the positive-logic sequential circuit FF12_d.

In the series path DPS13, by replacing the positive-logic sequential circuits FF11_b and FF12_c with negative-logic sequential circuits FF13_b and FF13_c, deleting the inverters INV_b and INV_c, and adding a logic matching inverter INV_a at the subsequent stage of the positive-logic combinational circuit CMBLp_a, the number of gate stages in the series path is optimized. That is, by replacing the positive-logic sequential circuit FF11_b with the negative-logic sequential circuit FF13_b, the number of gate stages decreases by one. By adding the logic matching inverter INV_a so that the negative-logic sequential circuit FF13_b receives the output of the positive-logic combinational circuit CMBLp_a at its negative-logic input terminal, the number of gate stages increases by one. By replacing the positive-logic sequential circuit FF12_c with the negative-logic sequential circuit FF13_c, the number of gate stages decreases by one. By deleting the inverter INV_b because the negative-logic sequential circuit FF13_c can directly receive the negative-logic output of the negative-logic combinational circuit CMBLn_b at its negative-logic input terminal Dn/, the number of gate stages decreases by one. By deleting the inverter INV_c because the positive-logic combinational circuit CMBLp_c receives the negative-logic inverted signal outputted from the negative-logic sequential circuit FF13_c, the number of gate stages decreases by one. The logic value of a signal inputted to and outputted from the series path DPS13 matches the logic value of a signal inputted to and outputted from the series path DPS12. Therefore, according to the example of optimization by which the series path DPS12 is replaced with the series path DPS13, the total number of gate stages can be decreased by two, and 16 gate stages and 17 gate stages (critical paths) in the series path DPS12 are improved to 15 gate stages and 16 gate stages in the series path DPS13, respectively.

Figure 19:
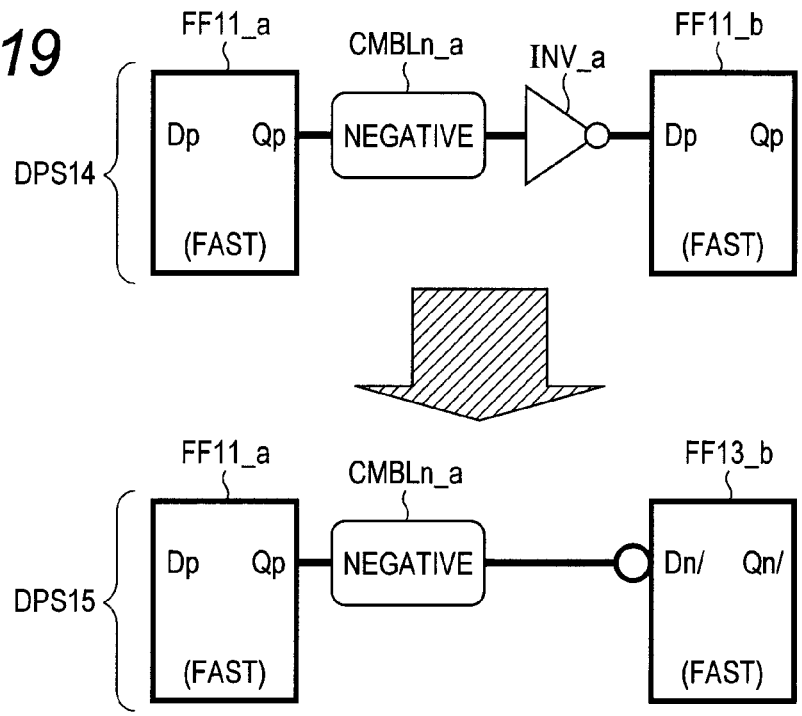
FIG. 19 is an explanation diagram showing another example of optimization processing in logic synthesis.

FIG. 19 shows another example of optimization processing in logic synthesis. In FIG. 10, with a series path containing a negative-logic combinational circuit CMBLn_a, a series path DPS14 configured by adding only the positive-logic sequential circuits FF11 to the combinational circuit and a series path DPS15 configured by adding not only the positive-logic sequential circuit FF1 but also the negative-logic sequential circuit FF13 to the combinational circuit are illustrated. In the series path DPS14, a positive-logic sequential circuit FF11_a is disposed at the preceding stage of the negative-logic combinational circuit CMBLn_a, and an inverter INV_a and a positive-logic sequential circuit FF11_b are disposed at the subsequent stage of the negative-logic combinational circuit CMBLn_a. The inverter INV_a functions as a logic matching inverter for supplying the negative-logic output of the negative-logic combinational circuit CMBLn_a to the positive-logic sequential circuit FF11_b.

In the series path DPS15, by replacing the positive-logic sequential circuit FF11_b with a negative-logic sequential circuit FF13_b and deleting the inverter INV_a, the number of gate stages in the series path is optimized. That is, by replacing the positive-logic sequential circuit FF11_b with the negative-logic sequential circuit FF13_b, the number of gate stages decreases by one. By deleting the inverter INV_a because the negative-logic sequential circuit FF13_b can directly receive the negative-logic output of the negative-logic combinational circuit CMBLn_a at its negative-logic input terminal Dn/, the number of gate stages decreases by one. The logic value of a signal inputted to and outputted from the series path DPS14 matches the logic value of a signal inputted to and outputted from the series path DPS15. Therefore, according to the example of optimization by which the series path DPS14 is replaced with the series path DPS15, the total number of gate stages can be decreased by two, one of which is due to the deletion of the logic matching inverter INV_a.

FIG. 20 shows yet another example of optimization processing in logic synthesis. In FIG. 20, with a series path containing a positive-logic combinational circuit CMBLp_a, a series path DPS16 configured by adding only the positive-logic sequential circuits FF12 to the combinational circuit and a series path DPS17 configured by adding not only the positive-logic sequential circuit FF12 but also the negative-logic sequential circuit FF13 to the combinational circuit are illustrated. In the series path DPS16, a positive-logic sequential circuit FF12_a is disposed at the preceding stage of the positive-logic combinational circuit CMBLp_a, and an inverter INV_a and a positive-logic sequential circuit FF12_b are disposed at the subsequent stage of the positive-logic combinational circuit CMBLp_a. The inverter INV_a functions as a logic matching inverter for supplying the inverted signal of a positive-logic output outputted from the positive-logic combinational circuit CMBLp_a to the positive-logic sequential circuit FF12_b.

In the series path DPS17, by replacing the positive-logic sequential circuit FF12_b with a negative-logic sequential circuit FF13_b and deleting the inverter INV_a, the number of gate stages in the series path is optimized. That is, by replacing the positive-logic sequential circuit FF12_b with the negative-logic sequential circuit FF13_b, the number of gate stages decreases by one. By deleting the inverter INV_a because the negative-logic sequential circuit FF13_b can directly receive the inverted output signal of the positive-logic combinational circuit CMBLp_a as a negative-logic signal at its negative-logic input terminal Dn/, the number of gate stages decreases by one. The logic value of a signal inputted to and outputted from the series path DPS16 matches the logic value of a signal inputted to and outputted from the series path DPS17. Therefore, according to the example of optimization by which the series path DPS16 is replaced with the series, path DPS17, the total number of gate stages can be decreased by two, one of which is due to the deletion of the logic matching inverter INV_a.

A logic circuit design method using the above-described optimization processing can be implemented using the system of FIG. 12. Series-path optimization processing in logic synthesis with the negative-logic sequential circuits FF13 and FF14 added to components also can be performed in accordance with the process flow of FIG. 13.

According to this embodiment, the following operational effects can be obtained.

(1) As shown in FIG. 19, by replacing the first sequential circuit FF11_b with the third sequential circuit FF13_b as necessary in the optimization processing, it is possible to delete, for example, the one inverter INV_a from the circuit disposed in the input stage of the first sequential circuit FF11_b. Therefore, it is possible to decrease the number of gate stages by deleting redundant inverters disposed in the logic circuit including the series path of clock synchronous sequential circuits and combinational circuits.

(2) As shown in FIG. 18 (FIG. 20), in the case where the polarity matching inverter INV_b (INV_a in FIG. 20) for positive logic can be disposed in the final stage of the combinational circuit coupled to the positive-logic input terminal of the second sequential circuit FF12_c in FIG. 18 (FF12_b in FIG. 20), the computer device deletes the polarity matching inverter and replaces the second sequential circuit with the third sequential circuit FF13_c (FF13_b in FIG. 20) in the optimization processing. This can contribute to a decrease in the number of gate stages in the critical path by deleting the polarity matching inverter for positive logic.

(3) As illustrated in FIGS. 14 to 17, the number of gate stages in the first sequential circuit FF11 is smaller by one than the number of gate stages in the second sequential circuit FF12, the number of gate stages in the third sequential circuit FF13 is smaller by one than the number of gate stages in the second sequential circuit FF12, the number of gate stages in the first sequential circuit FF11 is smaller by one than the number of gate stages in the fourth sequential circuit FF14, and the number of gate stages in the third sequential circuit FF13 is smaller by one than the number of gate stages in the fourth sequential circuit FF14. This makes it possible to decrease the number of gate stages within the sequential circuit itself by replacing FF12 with FF13 in FIGS. 18 and 20 and thereby ease the constraints of the number of gate stages in the critical path in the series path.

Third Embodiment

Figure 21:
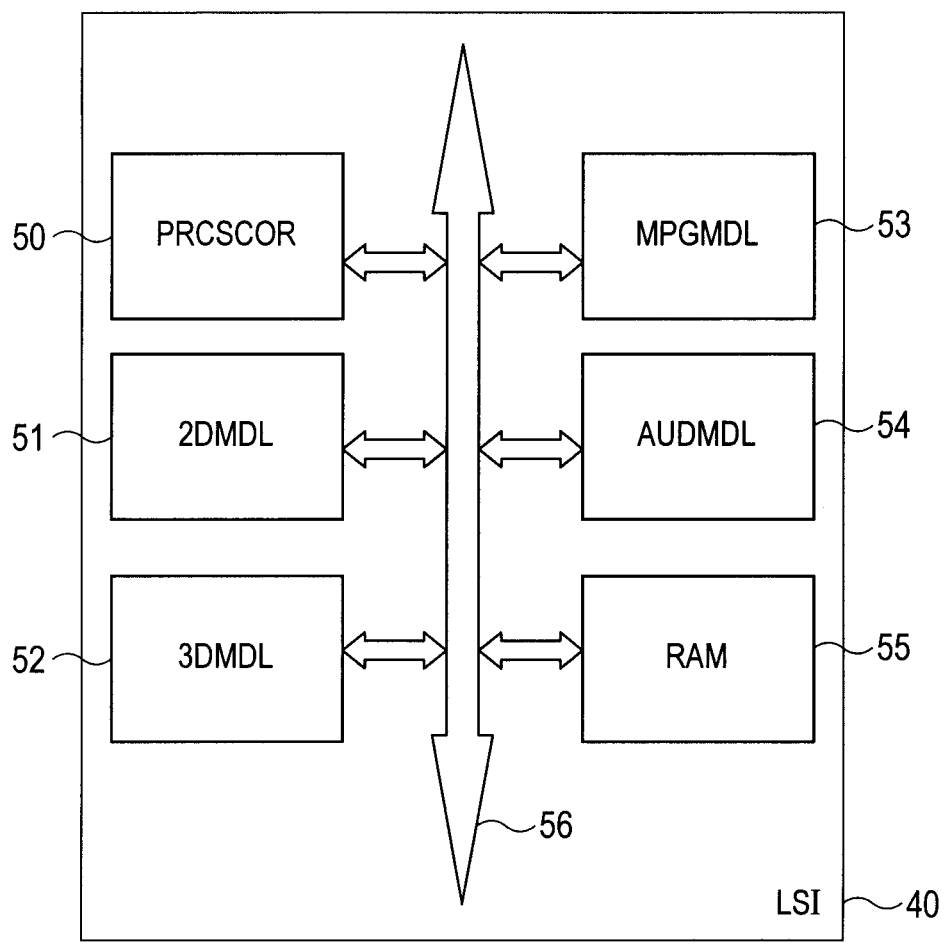
FIG. 21 is a block diagram illustrating a block configuration of a semiconductor integrated circuit manufactured using a net list obtained by executing a logic synthesis tool by a computer device.

FIG. 21 illustrates a block configuration of a semiconductor integrated circuit manufactured using the net list 31 obtained by executing the logic synthesis tool 30 by the computer device 3. Although not restricted, the semiconductor integrated circuit 40 shown in FIG. 21 is formed over a single semiconductor substrate made of, e.g., monocrystalline silicon, using a CMOS integrated circuit manufacturing technology.

The semiconductor integrated circuit (LSI) 40 is a data processing device such as a microcomputer, a microprocessor, a processor, or a system-on-chip system LSI (SOC). In the semiconductor integrated circuit, a processor core (PRCSCOR) 50 having a CPU (central processing unit), cache memory, and the like, a two-dimensional graphics processing module (2DMDL) 51 as an accelerator, a three-dimensional graphics processing module (3DMDL) 52, an image compression/expansion module (MPGMDL) 53, an audio processing module (AUDMDL) 54, a RAM 55 used as work memory and data memory, and the like are coupled to an internal bus 56. Although not restricted, the circuit modules 50 to 55 perform logic operations under CPU program control or dedicated logic to perform predetermined data processing. Although not shown, the circuit modules 50 to 55 have logic circuits including series paths of clock synchronous sequential circuits and combinational circuits to perform data processing. The semiconductor integrated circuit 40 has the first sequential circuits FF1, FF11 having the positive-logic input terminal and the positive-logic non-inverted output terminal and the second sequential circuits FF2, FF12 having the positive-logic input terminal and the positive-logic inverted output terminal as well as the third sequential circuits FF3, FF13 having the negative-logic input terminal and the negative-logic non-inverted output terminal and the fourth sequential circuits FF4, FF14 having the negative-logic input terminal and the negative-logic inverted output terminal in the series paths of the logic circuits.

For example, as illustrated in FIG. 18 (FIG. 19), the series paths include the signal path through which the third sequential circuit FF13_c (FF13_b in FIG. 19) receives the output of the negative-logic combinational circuit CMBLn_b (CMBLn_a in FIG. 19) at its negative-logic input terminal. This eliminates the logic matching inverter for positive logic necessary in the case where the first sequential circuit receives the output of the negative-logic combinational circuit at its positive-logic input terminal.

Further, as illustrated in FIG. 9 (FIG. 10), the series paths include the signal path through which the fourth sequential circuit FF4_c (FF4_b in FIG. 10) receives the output of the negative-logic combinational circuit CMBLn_b (CMBLn_a in FIG. 10) at its negative-logic input terminal. This eliminates the logic matching inverter for positive logic necessary in the case where the second sequential circuit receives the output of the negative-logic combinational circuit at its positive-logic input terminal.

By way of yet another example, as illustrated in FIG. 20, the series paths include the signal path through which the third sequential circuit FF13_b receives the output of the positive-logic combinational circuit CMBLp_a at its negative-logic input terminal. This eliminates the logic matching inverter for positive logic necessary for the output of the positive-logic combinational circuit which operates in response to a negative-logic signal.

Furthermore, as illustrated in FIG. 11, the series paths include the signal path through which the fourth sequential circuit FF4_b receives the output of the positive-logic combinational circuit CMBLp_a at its negative-logic input terminal. This eliminates the logic matching inverter for positive logic necessary for the output of the positive-logic combinational circuit which operates in response to a negative-logic signal.

Therefore, it is possible to decrease the number of gate stages by deleting the redundant inverters disposed in the logic circuits including the series paths of the clock synchronous sequential circuits and the combinational circuits.

While the invention made above by the present inventors has been described specifically based on the illustrated embodiments, the present invention is not limited thereto. It is needless to say that various changes and modifications can be made thereto without departing from the spirit and scope of the invention.

For example, the types and functions of sequential circuits and the number of gate stages are not limited to the above embodiments, and can obviously be changed as appropriate.

The semiconductor integrated circuit manufactured using the logic circuit design method according to the invention can be identified, through circuit coupling in the series path, based on whether positive-logic sequential circuits or negative-logic sequential circuits are included in the semiconductor integrated circuit. If this is difficult, a difference in the number of gate stages indicated with different components of sequential circuits with the same hardware description and logic synthesis tool makes it possible to presume the use of the method. If the modification of the IP module is prohibited in general as described above, a difference in circuit configuration designed with the same IP module indicates that different components are used.

What is claimed is:

1. A logic circuit design method in which a computer device performs logic synthesis using hardware description and a component in a cell library and generates a net list of a logic circuit including a series path of a clock synchronous sequential circuit and a combinational circuit, the logic circuit design method comprising the step of:

performing, by the computer device, optimization processing for decreasing the number of gate stages in a critical path in the series path by using a third sequential circuit having a negative-logic input terminal and a negative-logic non-inverted output terminal and a fourth sequential circuit having a negative-logic input terminal and a negative-logic inverted output terminal, wherein in the case where a polarity matching inverter for positive logic can be disposed in a final stage of a combinational circuit coupled to a positive-logic input terminal of the first sequential circuit, the computer device deletes the polarity matching inverter and replaces the first sequential circuit with the fourth sequential circuit in the optimization processing in addition to a first sequential circuit having a positive-logic input terminal and a positive-logic non-inverted output terminal and a second sequential circuit having a positive-logic input terminal and a positive-logic inverted output terminal.

2. The logic circuit design method according to claim 1, wherein the number of gate stages in the second sequential circuit is smaller by one than the number of gate stages in the first sequential circuit, the number of gate stages in the fourth sequential circuit is smaller by one than the number of gate stages in the first sequential circuit, the number of gate stages in the second sequential circuit is smaller by one than the number of gate stages in the third sequential circuit, and the number of gate stages in the fourth sequential circuit is smaller by one than the number of gate stages in the third sequential circuit.

3. The logic circuit design method according to claim 1, wherein in the case where a polarity matching inverter for positive logic can be disposed in a final stage of a combinational circuit coupled to a positive-logic input terminal of the second sequential circuit, the computer device deletes the polarity matching inverter and replaces the second sequential circuit with the third sequential circuit in the optimization processing.

4. The logic circuit design method according to claim 3, wherein the number of gate stages in the first sequential circuit is smaller by one than the number of gate stages in the second sequential circuit, the number of gate stages in the third sequential circuit is smaller by one than the number of gate stages in the second sequential circuit, the number of gate stages in the first sequential circuit is smaller by one than the number of gate stages in the fourth sequential circuit, and the number of gate stages in the third sequential circuit is smaller by one than the number of gate stages in the fourth sequential circuit.

5. The logic circuit design method according to claim 1, wherein the cell library has the first sequential circuit, the second sequential circuit, the third sequential circuit, and the fourth sequential circuit as separate components.

6. A non-transitory computer readable medium storing a logic design program which can be executed by a computer device which performs logic synthesis using hardware description and a component in a cell library and generates a net list of a logic circuit including a series path of a clock synchronous sequential circuit and a combinational circuit, the logic design program causing the computer device to execute the step of:

performing optimization processing for decreasing the number of gate stages in a critical path in the series path by using a third sequential circuit having a negative-logic input terminal and a negative-logic non-inverted output terminal and a fourth sequential circuit having a negative-logic input terminal and a negative-logic inverted output terminal, wherein in the case where a polarity matching inverter for positive logic can be disposed in a final stage of a combinational circuit coupled to a positive-logic input terminal of the first sequential circuit, the computer device deletes the polarity matching inverter and replaces the first sequential circuit with the fourth sequential circuit in the optimization processing in addition to a first sequential circuit having a positive-logic input terminal and a positive-logic non-inverted output terminal and a second sequential circuit having a positive-logic input terminal and a positive-logic inverted output terminal.

7. The non-transitory computer readable medium storing the logic design program according to claim 6, wherein in the case where a polarity matching inverter for positive logic can be disposed in a final stage of a combinational circuit coupled to a positive-logic input terminal of the first sequential circuit, the optimization processing includes processing for deleting the polarity matching inverter and replacing the first sequential circuit with the fourth sequential circuit.

8. The non-transitory computer readable medium storing the logic design program according to claim 7, wherein the number of gate stages in the second sequential circuit is smaller by one than the number of gate stages in the first sequential circuit, the number of gate stages in the fourth sequential circuit is smaller by one than the number of gate stages in the first sequential circuit, the number of gate stages in the second sequential circuit is smaller by one than the number of gate stages in the third sequential circuit, and the number of gate stages in the fourth sequential circuit is smaller by one than the number of gate stages in the third sequential circuit.

9. The non-transitory computer readable medium storing the logic design program according to claim 6, wherein in the case where a polarity matching inverter for positive logic can be disposed in a final stage of a combinational circuit coupled to a positive-logic input terminal of the second sequential circuit, the optimization processing includes processing for deleting the polarity matching inverter and replacing the second sequential circuit with the third sequential circuit.

10. The non-transitory computer readable medium storing the logic design program according to claim 9, wherein the number of gate stages in the first sequential circuit is smaller by one than the number of gate stages in the second sequential circuit, the number of gate stages in the third sequential circuit is smaller by one than the number of gate stages in the second sequential circuit, the number of gate stages in the first sequential circuit is smaller by one than the number of gate stages in the fourth sequential circuit, and the number of gate stages in the third sequential circuit is smaller by one than the number of gate stages in the fourth sequential circuit.

11. The non-transitory computer readable medium storing the logic design program according to claim 6, wherein the optimization processing reads and uses the first sequential circuit, the second sequential circuit, the third sequential circuit, and the fourth sequential circuit as separate components from the cell library.

12. A semiconductor integrated circuit which has a logic circuit including a series path of a clock synchronous sequential circuit and a combinational circuit and performs data processing, the semiconductor integrated circuit comprising:

in the series path of the logic circuit,
a first sequential circuit having a positive-logic input terminal and a positive-logic non-inverted output terminal;
a second sequential circuit having a positive-logic input terminal and a positive-logic inverted output terminal;
a third sequential circuit having a negative-logic input terminal and a negative-logic non-inverted output terminal, wherein in the case where a polarity matching inverter for positive logic can be disposed in a final stage of a combinational circuit coupled to a positive-logic input terminal of the first sequential circuit, the computer device deletes the polarity matching inverter and replaces the first sequential circuit with the fourth sequential circuit in the optimization processing; and
a fourth sequential circuit having a negative-logic input terminal and a negative-logic inverted output terminal.

* * * * *